(12) United States Patent
Yamanaka

(10) Patent No.: US 10,170,045 B2
(45) Date of Patent: Jan. 1, 2019

(54) DISPLAY DEVICE AND DRIVING METHOD OF THE SAME

(71) Applicant: Sharp Kabushiki Kaisha, Osaka-shi, Osaka (JP)

(72) Inventor: Shigetsugu Yamanaka, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 391 days.

(21) Appl. No.: 14/902,382

(22) PCT Filed: Jun. 24, 2014

(86) PCT No.: PCT/JP2014/066606
§ 371 (c)(1),
(2) Date: Dec. 31, 2015

(87) PCT Pub. No.: WO2015/002010
PCT Pub. Date: Jan. 8, 2015

(65) Prior Publication Data
US 2016/0372043 A1 Dec. 22, 2016

(30) Foreign Application Priority Data

Jul. 1, 2013 (JP) .................................. 2013-137971

(51) Int. Cl.
*G09G 3/3258* (2016.01)
*G09G 3/20* (2006.01)
(Continued)

(52) U.S. Cl.
CPC ......... *G09G 3/3258* (2013.01); *G09G 3/2025* (2013.01); *G09G 3/3225* (2013.01);
(Continued)

(58) Field of Classification Search
CPC ... G09G 2300/0452; G09G 2310/0235; G09G 2320/0242; G09G 2320/0257;
(Continued)

(56) References Cited

U.S. PATENT DOCUMENTS 7,042,527 B2 * 5/2006 Imai ..................... H04N 9/3114
348/273
7,583,279 B2 * 9/2009 Brown Elliott ... G02F 1/133514
345/694

(Continued)

FOREIGN PATENT DOCUMENTS

JP 2002-072980 A 3/2002
JP 2005-266770 A 9/2005
(Continued)

OTHER PUBLICATIONS

Official Communication issued in International Patent Application No. PCT/JP2014/066606, dated Sep. 30, 2014.

*Primary Examiner* — Patrick N Edouard
*Assistant Examiner* — Douglas M Wilson
(74) *Attorney, Agent, or Firm* — Keating & Bennett, LLP

(57) ABSTRACT

A display device includes a display unit including multiple pixels, and a driving circuit that drives the display unit following a color assignation rule. The multiple pixels are classified into first through fourth groups such that groups to which the pixels belong are different from all groups to which pixels belong that are adjacent in eight directions, and pixels adjacent in 8 directions to pixels belonging to the same group, are of the same groups. The first through fourth colors are respectively assigned to the pixels of the first through fourth groups in the first subframe, the second through fourth and first colors are respectively assigned in the second subframe, the third, fourth, first, and second colors are respectively assigned in the third subframe, and the fourth and first through third colors are respectively assigned in the fourth subframe.

12 Claims, 27 Drawing Sheets

(51) Int. Cl.
*G09G 3/3266* (2016.01)
*G09G 3/3291* (2016.01)
*G09G 3/3225* (2016.01)
*G09G 3/3233* (2016.01)
*H01L 27/32* (2006.01)

(52) U.S. Cl.
CPC ......... *G09G 3/3233* (2013.01); *G09G 3/3266* (2013.01); *G09G 3/2003* (2013.01); *G09G 3/3291* (2013.01); *G09G 2300/0426* (2013.01); *G09G 2300/0452* (2013.01); *G09G 2300/0809* (2013.01); *G09G 2300/0861* (2013.01); *G09G 2310/0235* (2013.01); *G09G 2310/08* (2013.01); *G09G 2320/0242* (2013.01); *G09G 2320/0257* (2013.01); *H01L 27/3213* (2013.01)

(58) Field of Classification Search
CPC ............... G09G 3/2003; G09G 3/2025; G09G 2300/0809; H01L 27/3213; H04N 5/7441
See application file for complete search history.

(56) References Cited

U.S. PATENT DOCUMENTS

| | | | |
|---|---|---|---|
| 2002/0024618 A1* | 2/2002 | Imai | H04N 9/3114 348/743 |
| 2005/0200573 A1* | 9/2005 | Kwak | G09G 3/3233 345/76 |
| 2005/0200617 A1 | 9/2005 | Kwak et al. | |
| 2005/0225574 A1* | 10/2005 | Brown Elliott | G02F 1/133514 345/694 |

FOREIGN PATENT DOCUMENTS

| | | |
|---|---|---|
| JP | 2005-266773 A | 9/2005 |
| JP | 2010-014951 A | 1/2010 |
| JP | 2010-122461 A | 6/2010 |

* cited by examiner

|  | SCANNING LINE | DATA LINE | | LIGHT EMISSION CONTROL LINE |
|---|---|---|---|---|
|  |  | DL1 | DL2 |  |
| FIRST SUBFRAME INTERVAL | SL1 | R | G | EL1a |
|  | SL2 | D | B | EL2a |
| SECOND SUBFRAME INTERVAL | SL1 | G | B | EL1b |
|  | SL2 | R | D | EL2a |
| THIRD SUBFRAME INTERVAL | SL1 | B | D | EL1c |
|  | SL2 | G | R | EL2b |
| FOURTH SUBFRAME INTERVAL | SL1 | D | R | EL1c |
|  | SL2 | B | G | EL2c |

|  | SCANNING LINE | DATA LINE | | | | LIGHT EMISSION CONTROL LINE |
|---|---|---|---|---|---|---|
|  |  | DL1 | DL2 | DL3 | DL4 |  |
| FIRST SUBFRAME INTERVAL | SL1 | R | G | B | D | EL1a |
|  | SL2 | B | D | R | G | EL2a |
| SECOND SUBFRAME INTERVAL | SL1 | G | B | D | R | EL1b |
|  | SL2 | D | R | G | B | EL2b |
| THIRD SUBFRAME INTERVAL | SL1 | B | D | R | G | EL1c |
|  | SL2 | R | G | B | D | EL2c |
| FOURTH SUBFRAME INTERVAL | SL1 | D | R | G | B | EL1d |
|  | SL2 | G | B | D | R | EL2d |

|  | SCANNING LINE | DATA LINE | | LIGHT EMISSION CONTROL LINE |
|---|---|---|---|---|
|  |  | DL1 | DL2 |  |
| FIRST SUBFRAME INTERVAL | SL1 | R | B | EL1a |
|  | SL2 | G | D | EL2a |
|  | SL3 | B | R | EL3a |
|  | SL4 | D | G | EL4a |
| SECOND SUBFRAME INTERVAL | SL1 | G | D | EL1b |
|  | SL2 | B | R | EL2b |
|  | SL3 | D | G | EL3b |
|  | SL4 | R | B | EL4b |
| THIRD SUBFRAME INTERVAL | SL1 | B | R | EL1c |
|  | SL2 | D | G | EL2c |
|  | SL3 | R | B | EL3c |
|  | SL4 | G | D | EL4c |
| FOURTH SUBFRAME INTERVAL | SL1 | D | G | EL1d |
|  | SL2 | R | B | EL2d |
|  | SL3 | G | D | EL3d |
|  | SL4 | B | R | EL4d |

|  | SCANNING LINE | DATA LINE | | | | LIGHT EMISSION CONTROL LINE |
|---|---|---|---|---|---|---|
|  |  | DL1 | DL2 | DL3 | DL4 |  |
| FIRST SUBFRAME INTERVAL | SL1 | R | G | B | W | EL1a |
|  | SL2 | B | W | R | G | EL2a |
| SECOND SUBFRAME INTERVAL | SL1 | G | B | W | R | EL1b |
|  | SL2 | W | R | G | B | EL2b |
| THIRD SUBFRAME INTERVAL | SL1 | B | W | R | G | EL1c |
|  | SL2 | R | G | B | W | EL2c |
| FOURTH SUBFRAME INTERVAL | SL1 | W | R | G | B | EL1d |
|  | SL2 | G | B | W | R | EL2d | ns
DISPLAY DEVICE AND DRIVING METHOD OF THE SAME

TECHNICAL FIELD

The present disclosure relates to a display device and a driving method thereof, and more particularly relates to a display device that displays multiple subframes in one frame interval and a driving method thereof.

BACKGROUND ART

Organic EL (Electro Luminescence) display devices have come to gather attention in recent years as display devices that are thin, lightweight, and capable of high-speed response. Organic EL display devices have multiple pixels arrayed two-dimensionally. A typical pixel in an organic EL display device includes one organic EL element and one drive transistor. An organic EL element is a light-emitting element that emits light of a luminance corresponding to the amount of current passing through it. The drive transistor is provided serially with the organic EL element, and controls the amount of current flowing to the organic EL element.

Separately, there are conventionally known display devices according to a field-sequential color system. Field-sequential color system display devices display color by displaying multiple subframes in one frame interval. A liquid crystal display device that switches the light-emission color of the backlight among red, green, and blue, each subframe interval, displaying three subframes (subframes corresponding to red, green, and blue), in one frame interval, is a known field-sequential color system display device.

PTL 1 through 3 describe field-sequential color system organic EL display devices. A display device described in PTL 1, for example, displays three subframes in one frame interval. FIG. 36 is a circuit diagram of a pixel matrix of the display device described in FIG. 9 of PTL 1. Each pixel includes an organic EL element OLEDr that emits red light, an organic EL element OLEDg that emits green light, and an organic EL element OLEDb that emits blue light. Light-emission signal lines E1$r$, E2$r$, and E3$r$ are selected in a first subframe interval, light-emission signal lines E1$g$, E2$g$, and E3$g$ are selected in a second subframe interval, and light-emission signal lines E1$b$, E2$b$, and E3$b$ are selected in a third subframe interval. Accordingly, the (3×3) pixels illustrated in FIG. 36 are assigned the colors illustrated in FIG. 37 for the first through third subframes. The amount of circuits and layout footprint can be reduced with field-sequential color system organic EL display devices, by controlling the luminance of multiple field organic EL elements by a single drive transistor.

CITATION LIST

Patent Literature

PTL 1: Japanese Unexamined Patent Application Publication No. 2005-266770
PTL 2: Japanese Unexamined Patent Application Publication No. 2005-266773
PTL 3: Japanese Unexamined Patent Application Publication No. 2010-14951

SUMMARY OF INVENTION

Technical Problem

However, field-sequential color system organic EL display devices have a problem in that color breakup or streaks occur in the displayed image, so the image quality of the displayed image is lower. For example, considering a case of displaying an image where a white region (hereinafter referred to as region X) in a black background as illustrated in FIG. 38, if the region X moves in the horizontal direction at a constant speed (e.g., in the right direction at a speed of 20 pixels per subframe), red, green, and blue streaks are visually perceived at the left edge portion and right edge portion of the region X (the hatched portion in FIG. 39).

The reason that color breakup and streaks are visually perceived is that the human line of sight moves pursuing the region X, and the human eye recognizes images acquired as the accumulation of luminance in the direction of movement of the line of sight (hereinafter referred to as eye-tracked images). The degree of color breakup and streaks differs depending on the displayed image, and also differs depending on which color is assigned to each pixel in each subframe. In order to make streaks difficult to be visually perceived in field-sequential color system organic EL display devices, which color is assigned to each pixel in each subframe needs to be decided appropriately.

Accordingly, it is an object of the embodiment of the invention to provide a field-sequential color system display device in which color breakup and streaks are not readily visually perceived.

Solution to Problem

According to a first aspect of the embodiment of the invention, a display device configured to display multiple subframes in one frame interval includes:

a display unit including multiple pixels laid out arrayed in a first and a second direction; and a driving circuit configured to drive the display unit following a color assignation rule.

The color assignation rule is a rule that one of a first through a fourth color is assigned to each of the multiple pixels in a first through a fourth subframe.

In the color assignation rule, the multiple pixels are classified into first through fourth groups such that groups to which the pixels belong are different from all groups to which pixels belong that are adjacent in eight directions, and pixels adjacent in 8 directions to pixels belonging to the same group, are of the same groups, and the first through fourth colors are respectively assigned to the pixels of the first through fourth groups in the first subframe, the second through fourth and first colors are respectively assigned in the second subframe, the third, fourth, first, and second colors are respectively assigned in the third subframe, and the fourth and first through third colors are respectively assigned in the fourth subframe.

According to a second aspect of the embodiment of the invention, in the first aspect, in the color assignation rule, the multiple pixels are classified into the first through fourth groups such that pixels two pixels away in the first direction and two pixels away in the second direction belong to the same group.

According to a third aspect of the embodiment of the invention, in the first aspect, in the color assignation rule, the multiple pixels are classified into the first through fourth groups such that pixels two pixels away in the first direction and one pixel away in the second direction belong to the same group.

According to a fourth aspect of the embodiment of the invention, in the first aspect, in the color assignment rule, the multiple pixels are classified into the first through fourth groups such that pixels one pixel away in the first direction and two pixels away in the second direction belong to the same group.

According to a fifth aspect of the embodiment of the invention, in the first aspect, the display unit further includes multiple scanning lines, multiple data lines, and multiple light emission control lines, the drive circuits include a scanning line drive circuit configured to select the multiple scanning lines in order in each subframe interval, a data line drive circuit configured to apply, to the multiple data lines, voltage that corresponds to a video signal in each line interval in each subframe interval following the color assignment rule, and a light emission control line drive circuit configured to drive the multiple light emission control lines in each subframe interval following the color assignment rule, and the pixels include a data maintaining unit corresponding to one scanning line, one data line, and three or four light emission control lines, and holding voltage applied to a data line corresponding to a selection period of a corresponding scanning line, first through third light-emitting elements configured to emit light of the first through third colors, and first through third light emission control transistors provided between the data maintaining unit and the first through third light-emitting elements, having control terminals connected to a light emission control line of corresponding light emission control lines in accordance with the color assignment rule.

According to a sixth aspect of the embodiment of the invention, in the fifth aspect, the pixels further include a fourth light-emitting element configured to emit light of the fourth color, and a fourth light emission control transistor provided between the data maintaining unit and the fourth light-emitting element, having a control terminal connected to a fourth light emission control line corresponding to the fourth color, of four corresponding light emission control lines.

According to a seventh aspect of the embodiment of the invention, in the fifth aspect, the pixels further include a full-emission control circuit configured to electrically connect between the data maintaining unit and the first through third light-emitting elements when selection voltage is applied to the fourth light emission control line corresponding to the fourth color, of the four corresponding light emission control lines.

According to an eighth aspect of the embodiment of the invention, in the seventh aspect, the full-emission control circuit further includes three transistors of which control terminals and one conducting terminals are connected to the fourth light emission control line, and other conducting terminals are respectively connected to the control terminals of the first through third light emission control transistors.

According to a ninth aspect of the embodiment of the invention, in the seventh aspect, the full-emission control circuit further includes three transistors provided in parallel to the first through third light emission control transistors between the data maintaining unit and the first through third light-emitting elements, and having control terminals connected to the fourth light emission control line.

According to a tenth aspect of the embodiment of the invention, in the first aspect, the first through third colors are one of red, green, and blue, and the fourth color is black.

According to an eleventh aspect of the embodiment of the invention, in the first aspect, the first through third colors are one of red, green, and blue, and the fourth color is white.

According to a twelfth aspect of the embodiment of the invention, a driving method of a display device including multiple pixels laid out arrayed in a first and a second direction, multiple scanning lines, multiple data lines, and multiple light emission control lines, and configured to display multiple subframes in one frame interval, includes:

a step of selecting the multiple scanning lines in order in each subframe interval;

a step of applying voltage according to video signals to the multiple data lines, during each line interval of each subframe interval, following a color assignment rule; and a step of driving the multiple light emission control lines during each subframe interval, following the color assignation rule.

The color assignment rule is a rule that one of a first through a fourth color is assigned to each of the multiple pixels in a first through a fourth subframe.

In the color assignment rule, the multiple pixels are classified into first through fourth groups such that groups to which the pixels belong are different from all groups to which pixels belong that are adjacent in eight directions, and pixels adjacent in 8 directions to pixels belonging to the same group, are of the same groups, and the first through fourth colors are respectively assigned to the pixels of the first through fourth groups in the first subframe, the second through fourth and first colors are respectively assigned in the second subframe, the third, fourth, first, and second colors are respectively assigned in the third subframe, and the fourth and first through third colors are respectively assigned in the fourth subframe.

According to a thirteenth aspect of the embodiment of the invention, in the twelfth aspect, in the color assignment rule, the multiple pixels are classified into the first through fourth groups such that pixels two pixels away in the first direction and two pixels away in the second direction belong to the same group.

According to a fourteenth aspect of the embodiment of the invention, in the twelfth aspect, in the color assignment rule, the multiple pixels are classified into the first through fourth groups such that pixels two pixels away in the first direction and one pixel away in the second direction belong to the same group.

According to a fifteenth aspect of the embodiment of the invention, in the twelfth aspect, in the color assignment rule, the multiple pixels are classified into the first through fourth groups such that pixels one pixel away in the first direction and two pixels away in the second direction belong to the same group.

Advantageous Effects

According to the first and twelfth aspects of the embodiment of the invention, one of four colors is assigned to each of the pixels in each subframe, and four subframes are displayed in one frame interval. Accordingly, the color breakup occurring in the displayed image can be made to be harder to visually perceive, as compared to a case where three subframes are displayed in one frame interval. Also, the multiple pixels are classified into four groups such that groups to which the pixels belong are different from all groups to which pixels belong that are adjacent in eight directions, and pixels adjacent in 8 directions to pixels belonging to the same group, are of the same groups. A different color is assigned to the pixels of each group, in each subframe. Accordingly, the same color is prevented from being assigned to adjacent pixels in each subframe, enabling streaks occurring in the displayed image to be harder to visually perceive.

According to the second and thirteenth aspects of the embodiment of the invention, the multiple pixels are classified into four groups such that pixels two pixels away in the first direction and two pixels away in the second direction belong to the same group. A different color is assigned to the pixels of each group, in each subframe. Accordingly, the same color is prevented from being assigned to adjacent pixels in each subframe, enabling streaks occurring in the displayed image to be harder to visually perceive.

According to the third and fourteenth aspects of the embodiment of the invention, the multiple pixels are classified into four groups such that pixels two pixels away in the first direction and one pixel away in the second direction belong to the same group. A different color is assigned to the pixels of each group, in each subframe. Accordingly, the same color is prevented from being assigned to adjacent pixels in each subframe, enabling streaks occurring in the displayed image to be harder to visually perceive.

According to the fourth and fifteenth aspects of the embodiment of the invention, the multiple pixels are classified into four groups such that pixels one pixel away in the first direction and two pixels away in the second direction belong to the same group. A different color is assigned to the pixels of each group, in each subframe. Accordingly, the same color is prevented from being assigned to adjacent pixels in each subframe, enabling streaks occurring in the displayed image to be harder to visually perceive.

According to the fifth aspect of the embodiment of the invention, the display unit including the multiple pixels having the data maintaining unit and three light-emitting elements and three light emission control transistors, the multiple scanning lines, the multiple data lines, and the multiple light emission control lines, is driven using the scanning line drive circuit, the data line drive circuit operating following the color assignation rule, and the light emission control line drive circuit operating following the color assignation rule. Accordingly, the color of each pixel in each subframe can be controlled to a color according to the color of the video signal (e.g., a color corresponding to a red video signal) to which color is assigned to each pixel in each subframe.

According to the sixth aspect of the embodiment of the invention, using the pixels including the fourth light-emitting element and the fourth light emission control transistor enables the color of pixels assigned the fourth color to be controlled to a color according to the color of the video signal of the fourth color.

According to the seventh aspect of the embodiment of the invention, in a case where the fourth color is yielded by blending the first through third colors, using the pixels including the full-emission control circuit enables the color of pixels assigned the fourth color to be controlled to a color according to the color of the video signal of the fourth color.

According to the eighth aspect of the embodiment of the invention, the full-emission control circuit can be configured by providing three transistors of which control terminals and one conducting terminals are connected to the fourth light emission control line, and other conducting terminals of the three transistors are respectively connected to the control terminals of the three light emission control transistors.

According to the ninth aspect of the embodiment of the invention, the full-emission control circuit can be configured by providing three transistors in parallel to the three light emission control transistors, the control terminals of the three transistors being connected to the fourth light emission control line.

According to the tenth aspect of the embodiment of the invention, field-sequential color system display can be performed by assigning one of red, green, blue, and black, to each pixel in each subframe.

According to the eleventh aspect of the embodiment of the invention, field-sequential color system display can be performed by assigning one of red, green, blue, and white, to each pixel in each subframe.

DESCRIPTION OF EMBODIMENTS

Figure 1:
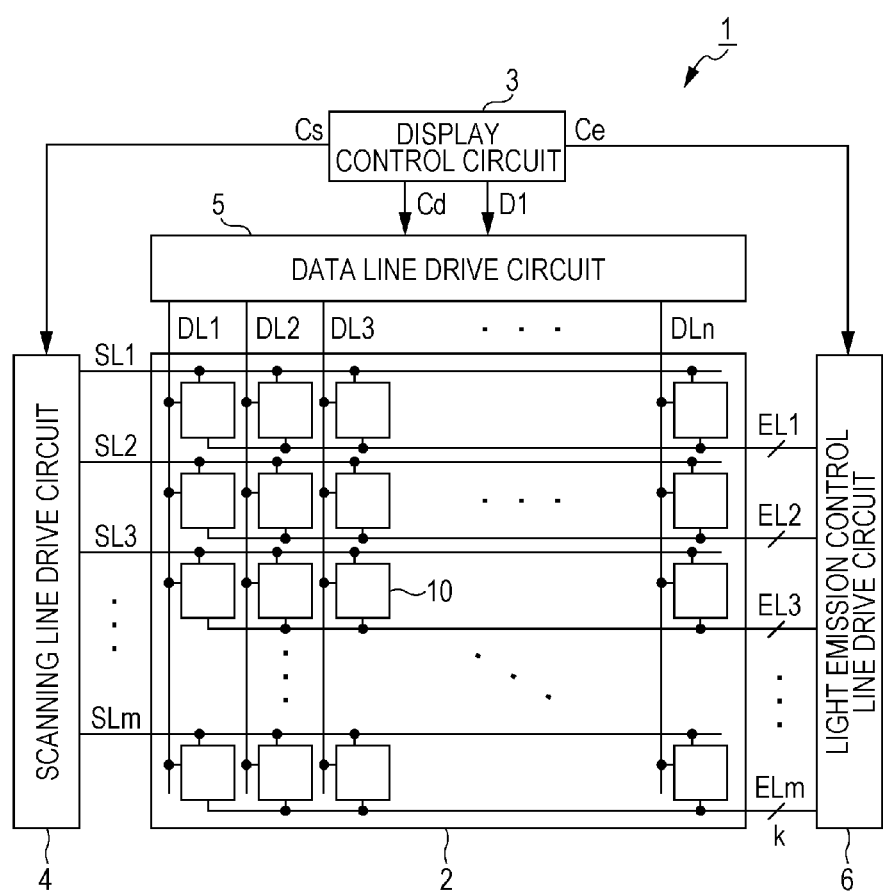
FIG. 1 is a block diagram illustrating the configuration of a display device according to an embodiment of the present invention.

FIG. 1 is a block diagram illustrating the configuration of a display device according to an embodiment of the present invention. The display device 1 illustrated in FIG. 1 includes a display unit 2, a display control circuit 3, a scanning line drive circuit 4, a data line drive circuit 5, and a light emission control line drive circuit 6. The display device 1 is a field-sequential color system organic EL display device. The display device 1 performs color display by dividing one frame interval into four subframe intervals (hereinafter referred to as first through fourth subframe intervals), and displaying four subframes in one frame interval. Hereinafter, m and n are integers of 2 or larger, and k is 3 or 4.

The display unit 2 includes m scanning lines SL1 through SLm, n data lines DL1 through DLn, (k×m) light emission control lines, and (m×n) pixels 10. EL1, EL2, ..., Elm in FIG. 1 each represent k light emission control lines corresponding to the scanning lines SL1 through SLm. The scanning lines SL1 through SLm and the (k×m) light emission control lines are disposed parallel to each other. The data lines DL1 through DLn are disposed parallel to each other and orthogonal to the scanning lines SL1 through SLm. The scanning lines SL1 through SLm and the data lines DL1 through DLn intersect at (m×n) points. The (m×n) pixels 10 are disposed corresponding to the intersections of the scanning lines SL1 through SLm and the data lines DL1 through DLn. Thus, the (m×n) pixels 10 are disposed arrayed in the direction in which the scanning lines SL1 through SLm extend (hereinafter referred to as horizontal direction) and the direction in which the data lines DL1 through DLn extend (hereinafter referred to as vertical direction). A pixel 10 includes three or four organic EL elements, and is connected to one scanning line, one data line, and k light emission control lines. Hereinafter, a pixel disposed corresponding to an intersection between scanning line SLi and data line DLj (where i is an integer 1 or larger but m or smaller, and j is an integer 1 or larger but n or smaller) will be referred to as P(i, j).

The display control circuit 3 controls the scanning line drive circuit 4, the data line drive circuit 5, and the light emission control line drive circuit 6. More specifically, the display control circuit 3 outputs a control signal Cs to the scanning line drive circuit 4, outputs a control signal Cd and a video signal D1 to the data line drive circuit 5, and a control signal Ce to the light emission control line drive circuit 6. One frame interval of the display device 1 includes four subframe intervals, and one subframe interval includes m line intervals (horizontal intervals). The control signals Cs and Ce include a signal indicating the start of a frame interval, a signal indicating the start of a subframe interval, a signal indicating the start of a line interval, and so forth. The control signal Cd includes a signal indicating the start of a line interval, a data clock signal, a data latch signal, and so forth.

The scanning line drive circuit 4 drives the scanning lines SL1 through SLm based on the control signal Cs. More specifically, the scanning line drive circuit 4 selects one scanning line from the scanning lines SL1 through SLm during each line interval of each subframe interval, and applies selection voltage (high-level voltage here) to the selected scanning line. The scanning line drive circuit 4 sequentially selects the scanning lines SL1 through SLm during each subframe interval by switching the selected scanning line at each line interval.

The data line drive circuit 5 drives the data lines DL1 through DLn based on the control signal Cd and video signal D1. More specifically, the data line drive circuit 5 generates n voltages (hereinafter referred to as data voltages) based on the video signal D1 during each line interval of each subframe interval, and applies the generated n data voltages to each of the data lines DL1 through DLn.

The light emission control line drive circuit 6 drives the (k×m) light emission control lines based on the control signal Ce. More specifically, the light emission control line drive circuit 6 selects one light emission control line out of the k light emission control lines corresponding to the selected scanning line, and applies the selection voltage to the selected light emission control line for a predetermined amount of time (A shorter time than one subframe interval. Hereinafter referred to as time Te). The organic EL elements within the pixel 10 selectively emit light under control of the light emission control line drive circuit 6.

During the selection interval of scanning line SLi, the n pixels 10 connected to the scanning line SLi are selected in batch. The n data voltages applied to the data lines DL1 through DLn are written to the selected n pixels 10 at this time. Subsequently, the light emission control line drive circuit 6 applies the selection voltage to one light emission control line selected from the k light emission control lines corresponding to the scanning line SLi, for the time Te. Accordingly, one or three organic EL elements corresponding to the selected light emission control line emit light for the time Te.

A pixel 10 includes at least an organic EL element that emits red light, an organic EL element that emits green light, and an organic EL element that emits blue light. There are cases where a pixel 10 includes an organic EL element that emits white light. A color assignation rule (hereinafter referred to as display pattern sequence) is stipulated for the display device 1, whereby one of four colors are assigned to each of the (m×n) pixels 10 in the first through fourth subframes. The organic EL elements in the pixels 10 selectively emit light in each subframe, following the display pattern sequence. The actual color of a pixel 10 (hereinafter referred to as display color) changes according to the data voltage written to the pixel 10. For example, in a case where red is assigned to a pixel P(1, 1) in the first subframe, only the organic EL element that emits red light in the pixel P(1, 1) emits light during the first subframe interval. The display color of the pixel P(1, 1) in the first subframe interval is a color corresponding to the red video signal.

The scanning line drive circuit 4 and data line drive circuit 5 write data voltages to the (m×n) pixels 10 during one subframe interval. The light emission control line drive circuit 6 controls the state of light emission of the organic EL elements in the (m×n) pixels 10 during each subframe interval. Accordingly, the display device 1 displays one subframe during one subframe interval. The display device 1 performs color display by displaying four subframes during one frame interval.

First Embodiment

Figure 2:
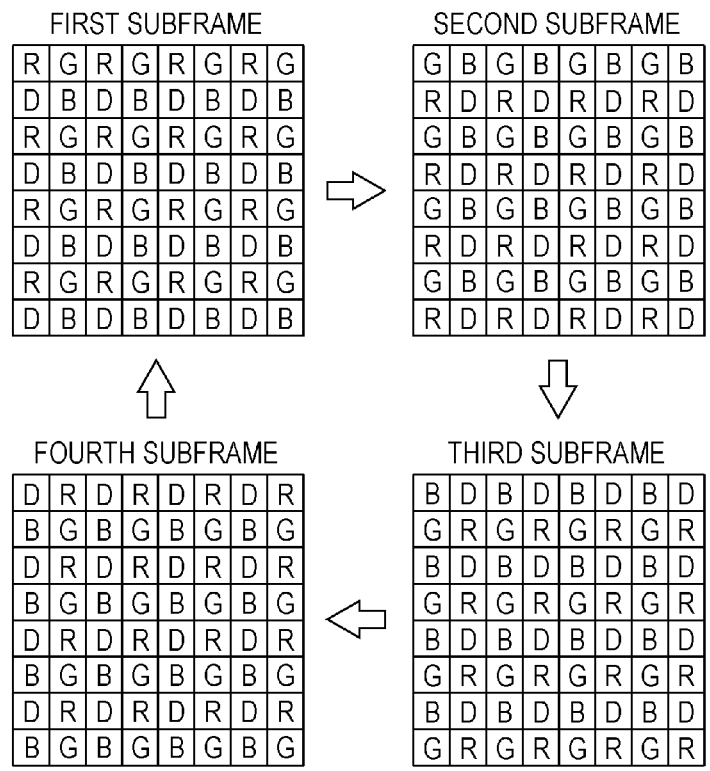
FIG. 2 is a diagram illustrating a display pattern sequence of a display device according to a first embodiment.
Figure 3:
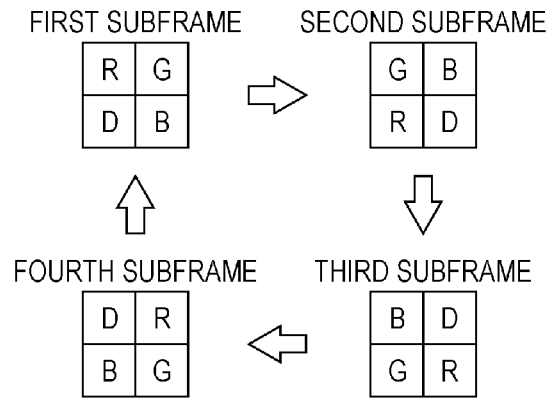
FIG. 3 is a diagram illustrating a part of FIG. 2.

FIG. 2 is a diagram illustrating a display pattern sequence of a display device according to a first embodiment. FIG. 3 is a diagram illustrating a part of FIG. 2. In FIG. 2, each square represents one pixel, and the letters in the squares represent the color assigned to that pixel. The letters R, G, B, and D represent red, green blue, and black, respectively.

The (m×n) pixels are classified into first through fourth groups in the present embodiment, such that pixels two pixels away in the horizontal direction and two pixels away in the vertical direction belong to the same group. Groups to which pixels P(1, 1), P(1, 2), P(2, 2), and P(2, 1) belong are respectively called the first through fourth groups in the present embodiment. Red, green, blue, and black are respectively assigned in the first subframe to the pixels of the first through fourth groups, green, blue, black, and red are respectively assigned in the second subframe, blue, black, red, and green are respectively assigned in the third subframe, and black, red, green, and blue are respectively assigned in the fourth subframe.

Figure 4:
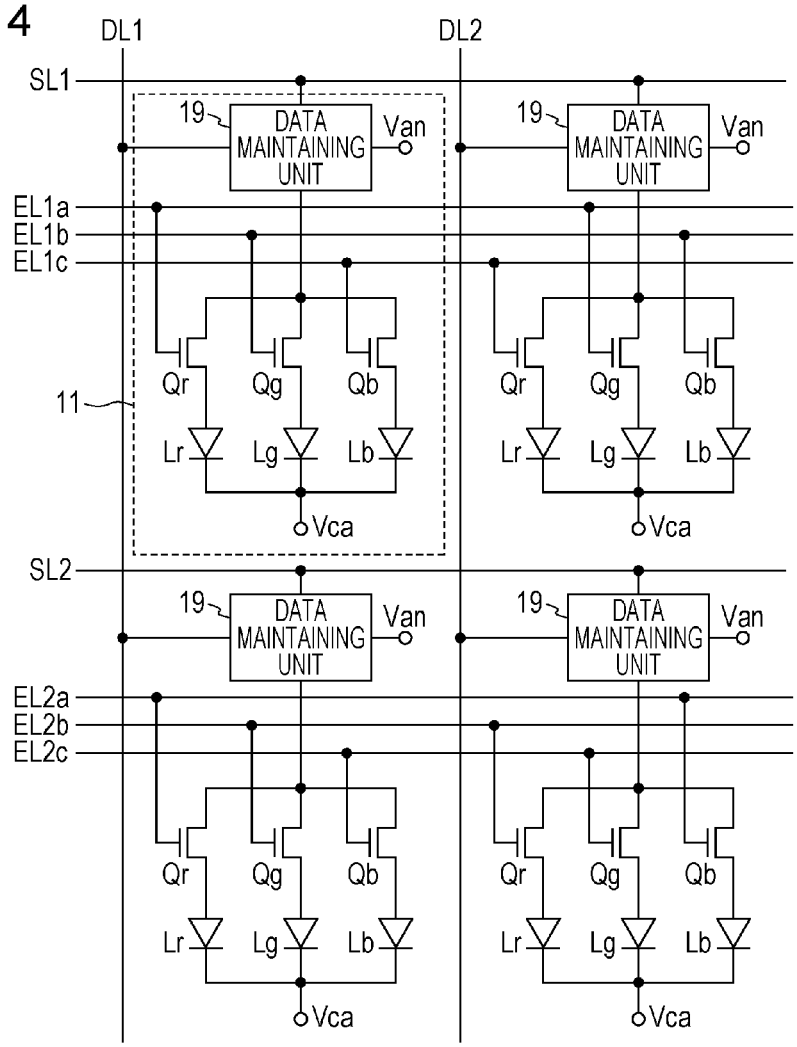
FIG. 4 is a diagram illustrating the configuration of a display unit of the display device according to the first embodiment.

FIG. 4 is a diagram illustrating the configuration of the display unit 2 according to the present embodiment. FIG. 4 shows the configuration of pixels P(1, 1), P(1, 2), P(2, 1), and P(2, 2). Other portions of the display unit 2 have the same configuration as that in FIG. 4. In the present embodiment, k=3, and pixel P(i, j) corresponds to scanning line SLi, data line DLj, and three light emission control lines ELia through ELic. A pixel 11 illustrated in FIG. 4 corresponds to pixel 10 in FIG. 1. The pixel 11 includes a data maintaining unit 19, three N-channel transistors Qr, Qg, and Qb, and three organic EL elements Lr, Lg, and Lb. The organic EL elements Lr, Lg, and Lb are light-emitting elements that respectively emit red, green, and blue light.

Figure 5:
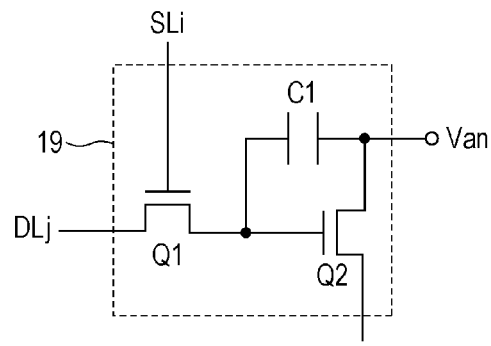
FIG. 5 is a circuit diagram of a data maintaining unit illustrated in FIG. 4.

FIG. 5 is a circuit diagram of the data maintaining unit 19 within pixel P(i, j). The data maintaining unit 19 includes N-channel transistors Q1 and Q2, and a capacitor C1, as illustrated in FIG. 5. The transistor Q1 is disposed between the data line DLj and the gate terminal of the transistor Q2, and the gate terminal of the transistor Q1 is connected to the scanning line SLi. High-level power source voltage Van is applied to the drain terminal of the transistor Q2, and the source terminal of the transistor Q2 is connected to the drain terminals of the transistors Qr, Qg, and Qb. The capacitor C1 is disposed between the drain terminal and gate terminal of the transistor Q2. The transistor Q1 functions as an input transistor, and the transistor Q2 functions as a drive transistor. The data maintaining unit 19 holds voltage applied to the data line DLj during the selection interval of the scanning line SLi. Note that the configuration of the data maintaining unit is optional, as long as it holds voltage applied to the corresponding data line during the selection interval of the corresponding scanning line.

The source terminals of the transistors Qr, Qg, and Qb are connected to the anode terminals of the organic EL elements Lr, Lg, and Lb, as illustrated in FIG. 4. Low-level power source voltage Vca (<Van) is applied to the cathode terminals of the organic EL elements Lr, Lg, and Lb. The gate terminals of the transistors Qr, Qg, and Qb are connected to one of the three light emission control lines ELia through ELic corresponding to the pixel P(i, j), according to the display pattern sequence illustrated in FIG. 2. Specifically, the gate terminals of the transistors Qr, Qg, and Qb in the pixel P(i, j) of the first and fourth groups are connected to the light emission control lines ELia, ELib, and ELic, respectively. The gate terminals of the transistors Qr, Qg, and Qb in the pixel P(i, j) of the second group are connected to the light emission control lines ELic, ELia, and ELib, respectively. The gate terminals of the transistors Qr, Qg, and Qb in the pixel P(i, j) of the third group are connected to the light emission control lines ELib, ELic, and ELia, respectively.

Figure 6:
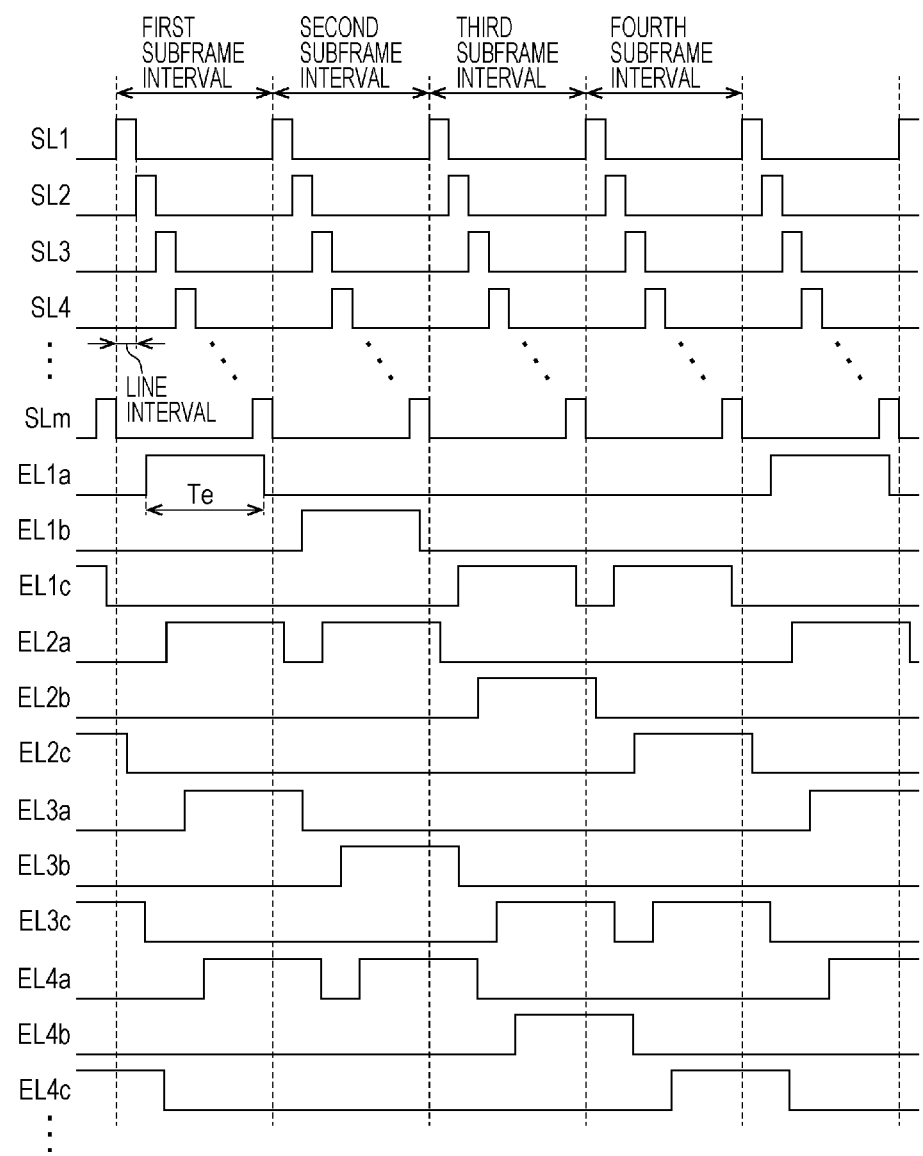
FIG. 6 is a timing chart of the display device according to the first embodiment.

FIG. 6 is a timing chart for the display device according to the present embodiment. The scanning lines SL1 through SLm are selected in order each line interval during each subframe interval, and selection voltage (high-level voltage) is applied to the selected scanning line over one line interval, as illustrated in FIG. 6. In the first subframe interval, the light emission control line ELia is selected after the scanning line SLi has been selected. In the second subframe interval, the light emission control line ELib is selected after an odd-numbered scanning line SLi has been selected, and the light emission control line ELia is selected after an even-numbered scanning line SLi has been selected. In the third subframe interval, the light emission control line ELic is selected after an odd-numbered scanning line SLi has been selected, and the light emission control line ELib is selected after an even-numbered scanning line SLi has been selected. In the fourth subframe interval, the light emission control line ELic is selected after the scanning line SLi has been selected. Selection voltage is applied to the selected light emission control line for the time Te.

Figures 7, 8:
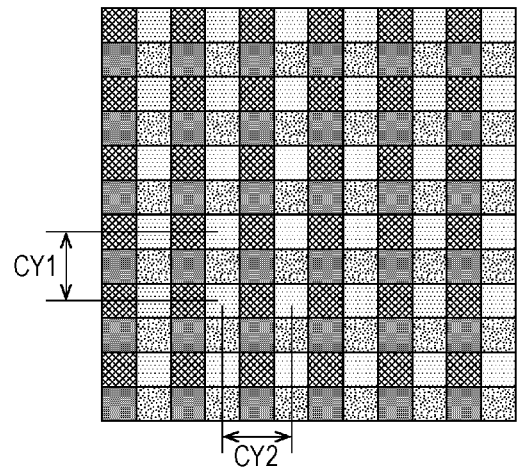
FIG. 7 is a diagram illustrating types of data voltage and selected light-emission control lines in the display device according to the first embodiment.
FIG. 8 is an enlarged diagram of an eye-tracked image in the display device according to the first embodiment.

FIG. 7 is a diagram illustrating the types of data voltage applied to the data lines during the scanning line selection interval, and the light emission control lines selected after the scanning interval of the scanning line. Data voltage corresponding to red, green, and blue video signals will hereinafter be referred to as R voltage, G voltage, and B voltage, and data voltage corresponding to minimal luminescence will be referred to as D voltage.

During the selection interval of the scanning line SL1 in the first subframe interval, R voltage and G voltage are respectively applied to the data lines DL1 and DL2, and these voltages are written to the respective pixels P(1, 1) and P(1, 2). Thereafter, the light emission control line EL1a is selected, and the transistor Qr within the pixel P(1, 1) and the transistor Qg within the pixel P(1, 2) turn on. Accordingly, the organic EL element Lr within the pixel P(1, 1) emits light of a luminescence according to the R voltage, and the organic EL element Lg within the pixel P(1, 2) emits light of a luminescence according to the G voltage.

During the selection interval of the scanning line SL2 in the first subframe interval, D voltage and B voltage are respectively applied to the data lines DL1 and DL2, and these voltages are written to the respective pixels P(2, 1) and P(2, 2). Thereafter, the light emission control line EL2a is selected, and the transistor Qr within the pixel P(2, 1) and the transistor Qb within the pixel P(2, 2) turn on. Accordingly, the organic EL element Lr within the pixel P(2, 1) emits light of minimal luminescence according to the D voltage, and the organic EL element Lb within the pixel P(2, 2) emits light of a luminescence according to the B voltage.

As a result, during the first subframe interval the display color of the pixel P(1, 1) is a color corresponding to the red video signal (a color within the range of black to red), the display color of the pixel P(1, 2) is a color corresponding to the green video signal (a color within the range of black to green), the display color of the pixel P(2, 1) is black (a color corresponding to the minimal luminescence), and the display color of the pixel P(2, 2) is a color corresponding to the blue video signal (a color within the range of black to blue).

The display device according to the present embodiment operates in the same manner as the first subframe interval in the second through fourth subframe intervals as well. Thus, the display device according to the present embodiment displays four subframes in one frame interval, following the display pattern sequence illustrated in FIG. 2.

The effects of the display device according to the present embodiment will be described below. The conventional field-sequential color system organic EL display device has the problem that color breakup and streaks occur in the displayed image. The shorter the display interval of each color is (i.e., the shorter the duration of the subframe interval is), the less readily color breakup is visually perceived. The display device according to the present embodiment displays four subframes in one frame interval. Thus, the display device according to the present embodiment enables color breakup occurring in the displayed image to be harder to visually perceive, as compared to a case where three subframes are displayed in one frame interval.

The display device according to the present embodiment operates following the display pattern sequence illustrated in FIG. 2. In the display pattern sequence in FIG. 2, the multiple pixels are classified into four groups such that pixels two pixels away in the horizontal direction and two pixels away in the vertical direction belong to the same group. A different color is assigned to the pixels of each group, in each subframe. Accordingly, the same color is prevented from being assigned to adjacent pixels in each subframe in the display device according to the present embodiment, enabling streaks occurring in the displayed image to be harder to visually perceive.

Figure 38:
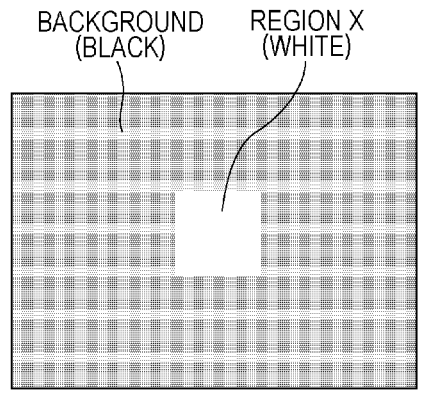
FIG. 38 is a diagram illustrating an example of a displayed image.
Figure 39:
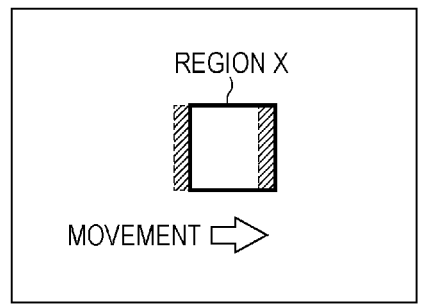
FIG. 39 is a diagram illustrating streaks occurring in a displayed image.

FIG. 8 is an enlarged view of an eye-tracked image in the display device according to the present embodiment. FIG. 8 is an enlarged view of the image which the human eye recognizes in the hatched portion in FIG. 39, in a case where the image illustrated in FIG. 38 is displayed. Each square in FIG. 8 represents one pixel, and the patterns that the squares are filled in with represent the display color of the pixels. An orthogonal grid point pattern occurs in the eye-tracked image illustrated in FIG. 8. A cycle CY1 at which pixels of the same color appear in the vertical direction is twice the pixel pitch. A cycle CY2 at which pixels of the same color appear in the horizontal direction also is twice the pixel pitch. Pixels of the same color do not continue in the eye-tracked image illustrated in FIG. 8, so it is difficult for the human eye to visually perceive streaks. For example, in a case where an image displayed on a 400 dpi high-definition display unit is viewed by the human eye from a distance of 30 cm, streaks occurring in the displayed image can hardly be visually perceived at all.

As described above, the display device according to the present embodiment has the display unit 2 including multiple pixels 11 arrayed two-dimensionally, and drive circuits that drive the display unit following a color assignation rule (display pattern sequence). The color assignation rule us a rule where each of the multiple pixels of the first through fourth subframes are assigned one of first through fourth colors (red, green, blue, and black). In the color assignation rule, the multiple pixels are classified into four groups such that pixels two pixels away in a first direction (direction in which the scanning lines extend) and two pixels away in a second direction (direction in which the data lines extend) belong to the same group. With regard to pixels of the first through fourth groups, the first through fourth colors are respectively assigned in the first subframe, the second through fourth colors and the first color are respectively assigned in the second subframe, the third, fourth, first, and second colors are respectively assigned in the third subframe, and the fourth color and the first through third colors are respectively assigned in the fourth subframe.

The display device according to the present embodiment enables color breakup occurring in displayed images to be harder to visually perceive by assigning one of four colors to each pixel in each subframe, and displaying four subframes in one frame interval, as compared to a case where three subframes are displayed in one frame interval. Also, the multiple pixels are classified into four groups such that pixels two pixels away in the first direction and two pixels away in the second direction belong to the same group, and a different color is assigned to the pixels of each group, in each subframe, whereby the same color is prevented from being assigned to adjacent pixels in each subframe, enabling streaks occurring in the displayed image to be harder to visually perceive.

The display unit further includes multiple scanning lines SL1 through SLm, multiple data lines DL1 through DLn, and multiple light emission control lines. The drive circuits include the scanning line drive circuit 4 that selects the multiple scanning lines in order in each subframe interval, the data line drive circuit 5 that applies to the multiple data lines voltage that corresponds to video signals D1 in each line interval in each subframe interval following the color assignation rule, and the light emission control line drive circuit 6 that drives the multiple light emission control lines in each subframe interval following the color assignment rule. The pixel P(i, j) corresponds to one scanning line SLi, one data line DLj, and three light emission control lines ELia through ELic. The pixel P(i, j) includes the data maintaining unit 19 that holds voltage applied to the corresponding data line DLj in the selection interval of the corresponding scanning line SLi, first through third light-emitting elements (organic EL elements Lr, Lg, and Lb) that respectively emit light of first through third colors, and first through third light emission control transistors (transistors Qr, Qg, and Qb) disposed between the data maintaining unit and first through third light-emitting elements and having control terminals (gate terminals) connected to, of the corresponding light emission control lines ELia through ELic, a light emission control line corresponding to the color assignment rule.

The display unit including multiple pixels having a data maintaining unit and three light-emitting elements and three light emission control transistors, multiple scanning lines, multiple data lines, and multiple light emission control lines, is thus driven using the scanning line drive circuit, data line drive circuit that operates following the color assignment rule, and light emission control line drive circuit that operates following the color assignment rule. Accordingly, the color of each pixel in each subframe can be controlled to a color according to the color of the video signal to which color is assigned to each pixel in each subframe.

Second Embodiment

Figure 9:
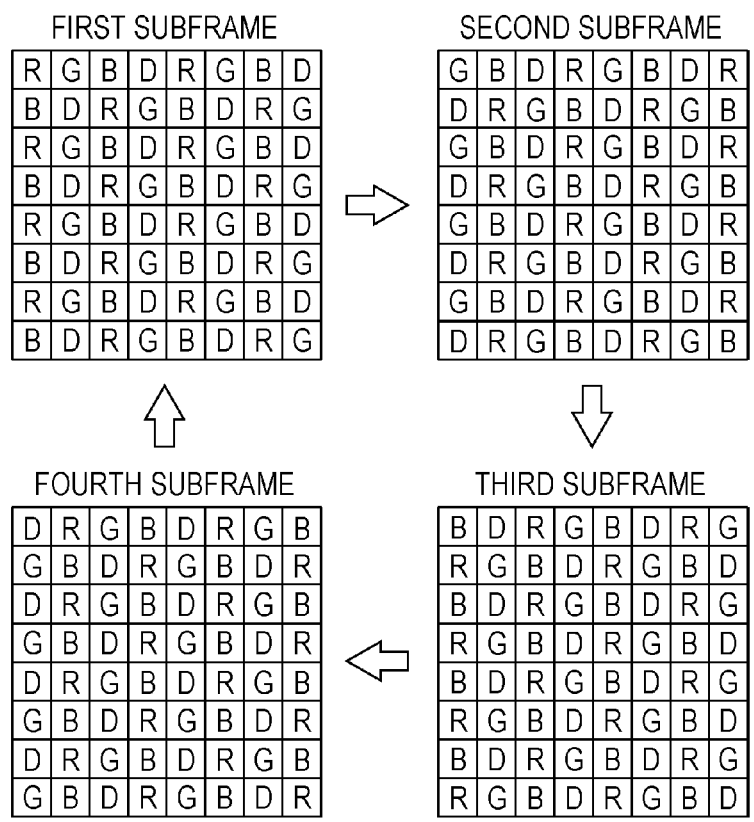
FIG. 9 is a diagram illustrating a display pattern sequence of a display device according to a second embodiment.
Figure 10:
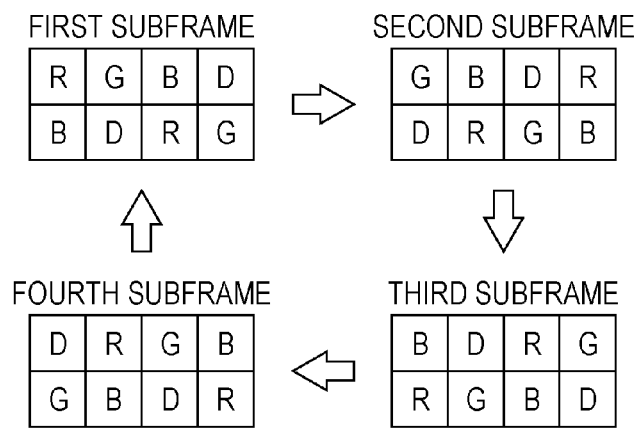
FIG. 10 is a diagram illustrating a part of FIG. 9.

FIG. 9 is a diagram illustrating a display pattern sequence of a display device according to a second embodiment. FIG. 10 is a diagram illustrating a part of FIG. 9. The (m×n) pixels are classified into first through fourth groups in the present embodiment, such that pixels two pixels away in the horizontal direction and one pixel away in the vertical direction belong to the same group. Groups to which pixels P(1, 1) through P(1, 4) belong are respectively called the first through fourth groups in the present embodiment. The colors assigned to the pixels of each group in each subframe are the same as in the first embodiment.

Figure 11:
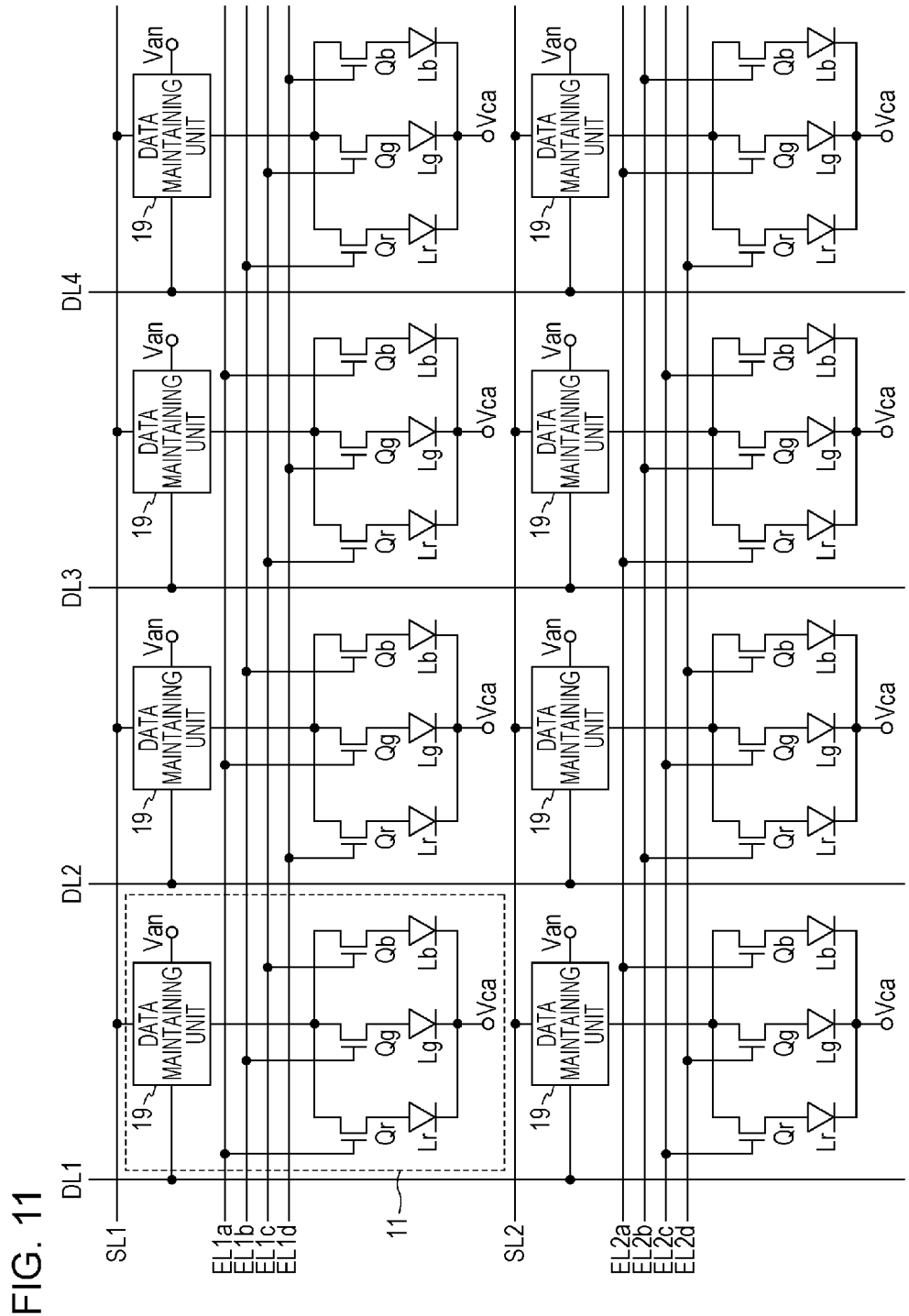
FIG. 11 is a diagram illustrating the configuration of a display unit of the display device according to the second embodiment.

FIG. 11 is a diagram illustrating the configuration of the display unit 2 according to the present embodiment. FIG. 11 shows the configuration of pixels P(1, 1) through P(1, 4) and P(2, 1) through P(2, 4). Other portions of the display unit 2 have the same configuration as that in FIG. 11. In the present embodiment, k=4, and pixel P(i, j) corresponds to scanning line SLi, data line DLj, and four light emission control lines ELia through ELid. The configuration of the display unit 2 is the same as that in the first embodiment, except for the connection of the gate terminals of the transistors Qr, Qg, and Qb and light emission control lines.

The gate terminals of the transistors Qr, Qg, and Qb are connected to one of the four light emission control lines ELia through ELid corresponding to the pixel P(i, j), in accordance with the display pattern sequence illustrated in FIG. 9. Specifically, the gate terminals of the transistors Qr, Qg, and Qb in the pixel P(i, j) of the first group are connected to the light emission control lines ELia, ELib, and ELic, respectively. The gate terminals of the transistors Qr, Qg, and Qb in the pixel P(i, j) of the second group are connected to the light emission control lines ELid, ELia, and ELib, respectively. The gate terminals of the transistors Qr, Qg, and Qb in the pixel P(i, j) of the third group are connected to the light emission control lines ELic, ELid, and ELia, respectively. The gate terminals of the transistors Qr, Qg, and Qb in the pixel P(i, j) of the fourth group are connected to the light emission control lines ELib, ELic, and ELid, respectively.

Figure 12:
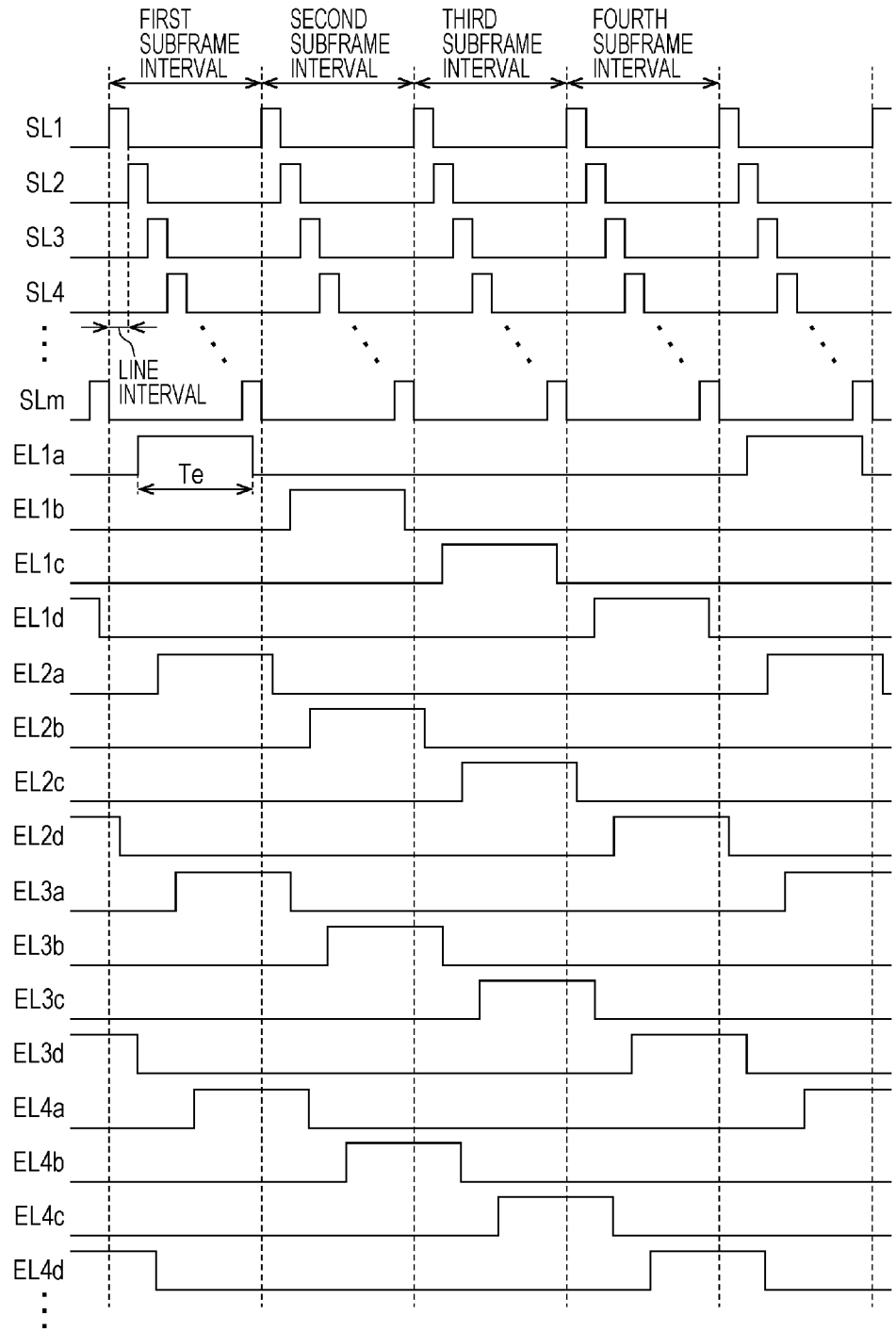
FIG. 12 is a timing chart of the display device according to the second embodiment.

FIG. 12 is a timing chart for the display device according to the present embodiment. The voltage of the scanning lines SL1 through SLm change in the same way as in the first embodiment. In the first subframe interval, the light emission control line ELia is selected after the scanning line SLi has been selected. In the second subframe interval, the light emission control line ELib is selected after the scanning line SLi has been selected. In the third subframe interval, the light emission control line ELic is selected after the scanning line SLi has been selected. In the fourth subframe interval, the light emission control line ELid is selected after the scanning line SLi has been selected. Selection voltage is applied to the selected light emission control line for the time Te.

Figures 13, 14:
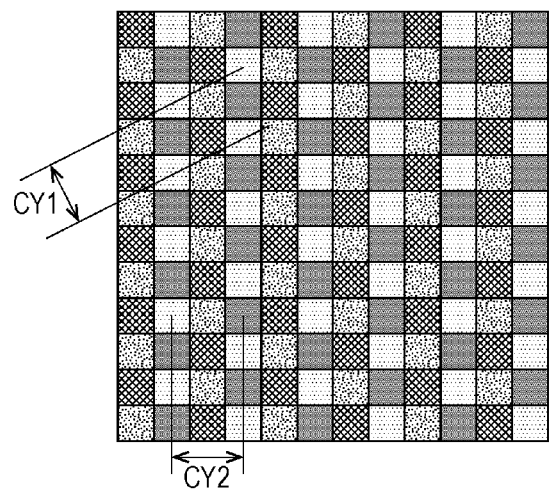
FIG. 13 is a diagram illustrating types of data voltage and selected light-emission control lines in the display device according to the second embodiment.
FIG. 14 is an enlarged diagram of an eye-tracked image in the display device according to the second embodiment.

FIG. 13 is a diagram illustrating the types of data voltage applied to the data lines during the scanning line selection interval, and the light emission control lines selected after the scanning interval of the scanning line. During the selection interval of the scanning line SL1 in the first subframe interval, R voltage, G voltage, B voltage, and D voltage are respectively applied to the data lines DL1 through DL4, and these voltages are written to the respective pixels P(1, 1) through (1, 4). Thereafter, the light emission control line EL1a is selected, and the transistor Qr within the pixel P(1, 1) the transistor Qg within the pixel P(1, 2), and the transistor Qb within the pixel P(1, 3), turn on. Accordingly, the organic EL element Lr within the pixel P(1, 1) emits light of a luminescence according to the R voltage, the organic EL element Lg within the pixel P(1, 2) emits light of a luminescence according to the G voltage, and the organic EL element Lb within the pixel P(1, 3) emits light of a luminescence according to the B voltage. None of the organic EL elements Lr, Lg, and Lb within the pixel P(1, 4) emit light, since the transistors Qr, Qg, and Qb within the pixel P(1, 4) are off.

During the selection interval of the scanning line SL2 in the first subframe interval, B voltage, D voltage, R voltage, and G voltage are respectively applied to the data lines DL1 through DL4, and these voltages are written to the respective pixels P(2, 1) through (2, 4). Thereafter, the light emission control line EL2a is selected, and the transistor Qb within the pixel P(2, 1) the transistor Qr within the pixel P(2, 3), and the transistor Qg within the pixel P(2, 4), turn on. Accordingly, the organic EL element Lb within the pixel P(2, 1) emits light of a luminescence according to the B voltage, the organic EL element Lr within the pixel P(2, 3) emits light of a luminescence according to the R voltage, and the organic EL element Lg within the pixel P(2, 4) emits light of a luminescence according to the G voltage. None of the organic EL elements Lr, Lg, and Lb within the pixel P(2, 2) emit light, since the transistors Qr, Qg, and Qb within the pixel P(2, 2) are off.

As a result, during the first subframe interval the display color of the pixels P(1, 1) and P(2, 3) is a color corresponding to the red video signal, the display color of the pixels P(1, 2) and P(2, 4) is a color corresponding to the green video signal, the display color of the pixels P(1, 3) and P(2, 1) is a color corresponding to the blue video signal, and the display color of the pixels P(1, 4) and P(2, 2) is black.

The display device according to the present embodiment operates in the same manner as the first subframe interval in the second through fourth subframe intervals as well. Thus, the display device according to the present embodiment displays four subframes in one frame interval, following the display pattern sequence illustrated in FIG. 9.

FIG. 14 is an enlarged view of an eye-tracked image in the display device according to the present embodiment. An oblique grid point pattern occurs in the eye-tracked image illustrated in FIG. 14. A cycle CY1 at which pixels of the same color appear in the oblique direction is $4/\sqrt{5}$ times (approximately 1.8 times) the pixel pitch. A cycle CY2 at which pixels of the same color appear in the horizontal direction also is twice the pixel pitch. Pixels of the same color do not continue in the eye-tracked image illustrated in FIG. 14, so it is difficult for the human eye to visually perceive streaks.

As described above, in the display device according to the present embodiment, the multiple pixels 11 are classified into four groups such that pixels two pixels away in the first direction (direction in which the scanning lines extend) and one pixel away in the second direction (direction in which the data lines extend) belong to the same group, in the color assignment rule (display pattern sequence). This classification and assigning of a different color to the pixels of each group, in each subframe, enables the same color to be prevented from being assigned to adjacent pixels in each subframe, so streaks occurring in the displayed image can be made to be harder to visually perceive.

While description has been made above regarding the display device according to the present embodiment that D voltage is written to pixels regarding which black is assigned, alternatively in the display device according to the present embodiment, any voltage other than D voltage may be written to pixels regarding which black is assigned, or no voltage has to be written to pixels regarding which black is assigned.

Third Embodiment

Figure 15:
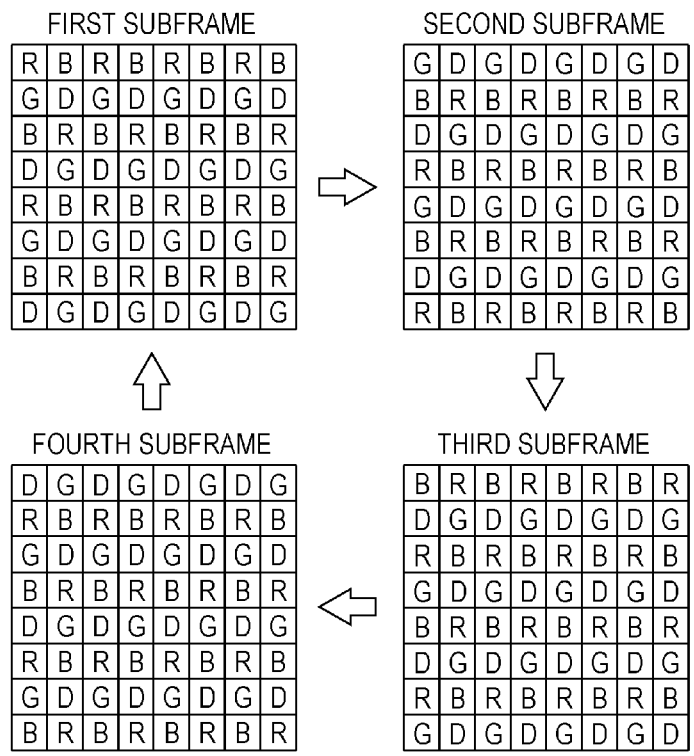
FIG. 15 is a diagram illustrating a display pattern sequence of a display device according to a third embodiment.
Figure 16:
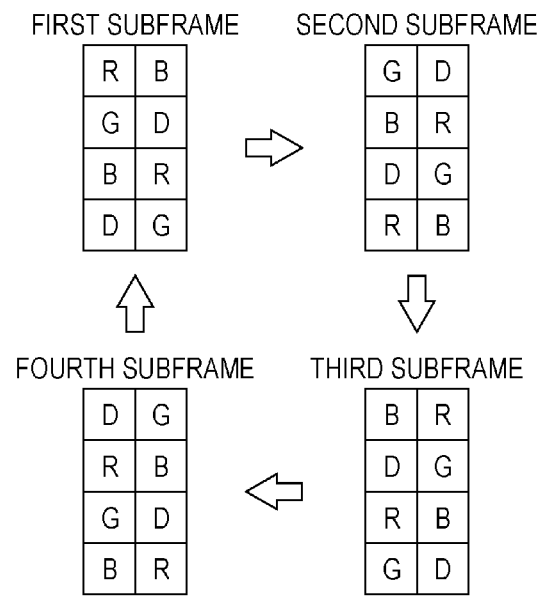
FIG. 16 is a diagram illustrating a part of FIG. 15.

FIG. 15 is a diagram illustrating a display pattern sequence of a display device according to a third embodiment. FIG. 16 is a diagram illustrating a part of FIG. 15. The (m×n) pixels are classified into first through fourth groups in the present embodiment, such that pixels one pixel away in the horizontal direction and two pixels away in the vertical direction belong to the same group. Groups to which pixels P(1, 1) through P(1, 4) belong are respectively called the first through fourth groups in the present embodiment. The colors assigned to the pixels of each group in each subframe are the same as in the first and second embodiments.

Figure 17:
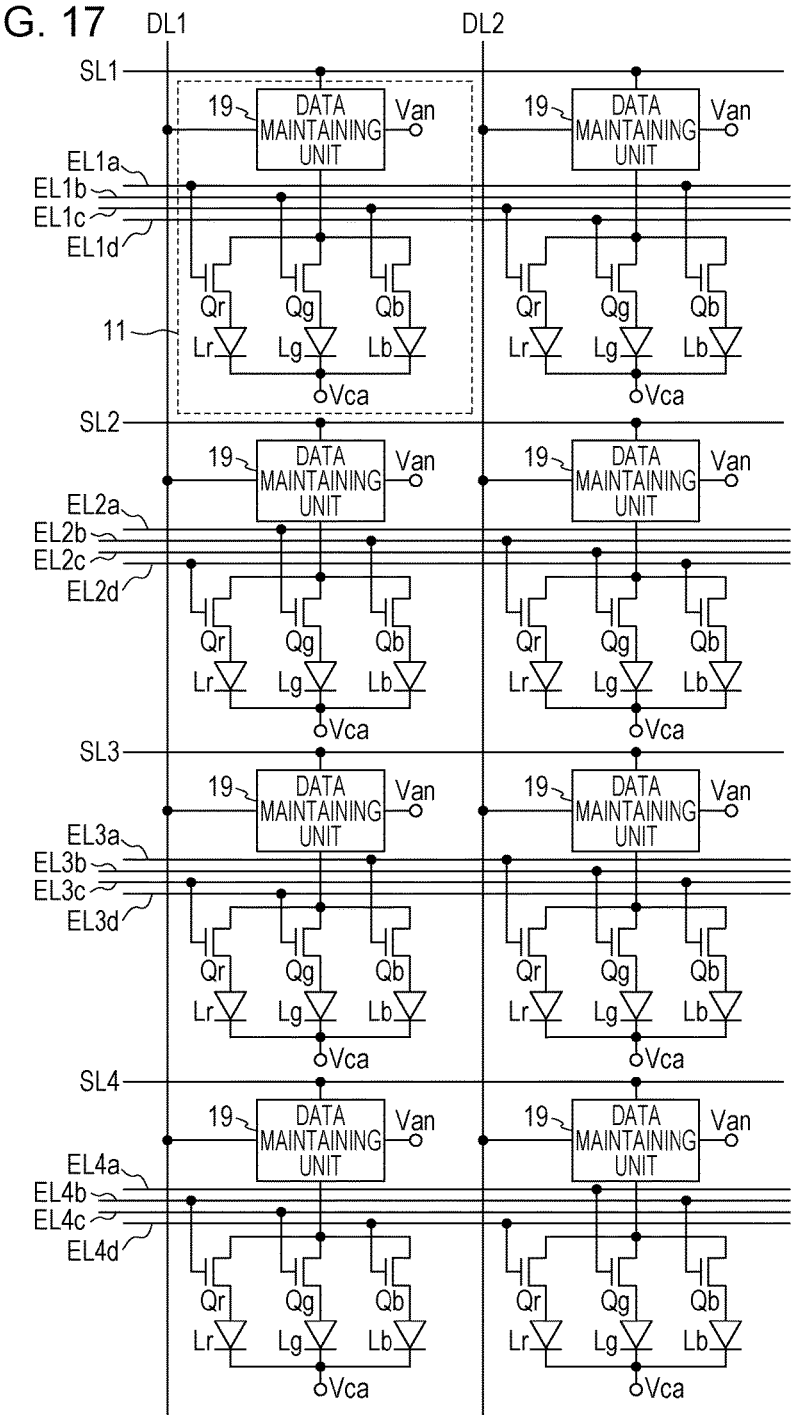
FIG. 17 is a diagram illustrating the configuration of a display unit of the display device according to the third embodiment.

FIG. 17 is a diagram illustrating the configuration of the display unit 2 according to the present embodiment. FIG. 17 shows the configuration of pixels P(1, 1) through P(4, 1) and P(1, 2) through P(4, 2). Other portions of the display unit 2 have the same configuration as that in FIG. 17. In the present embodiment, k=4, and pixel P(i, j) corresponds to scanning line SLi, data line DLj, and four light emission control lines ELia through ELid. The configuration of the display unit 2 is the same as that in the first and second embodiments, except for the connection of the gate terminals of the transistors Qr, Qg, and Qb and the light emission control lines.

The gate terminals of the transistors Qr, Qg, and Qb are connected to one of the four light emission control lines ELia through ELid corresponding to the pixel P(i, j), in accordance with the display pattern sequence illustrated in FIG. 15. Specifically, the gate terminals of the transistors Qr, Qg, and Qb in the pixel P(i, j) of the first group are connected to the light emission control lines ELia, ELib, and ELic, respectively. The gate terminals of the transistors Qr, Qg, and Qb in the pixel P(i, j) of the second group are connected to the light emission control lines ELid, ELia, and ELib, respectively. The gate terminals of the transistors Qr, Qg, and Qb in the pixel P(i, j) of the third group are connected to the light emission control lines ELic, ELid, and ELia, respectively. The gate terminals of the transistors Qr, Qg, and Qb in the pixel P(i, j) of the fourth group are connected to the light emission control lines ELib, ELic, and ELid, respectively. The timing chart for the display device according to the present embodiment is the same as that in FIG. 12.

Figures 18, 19:
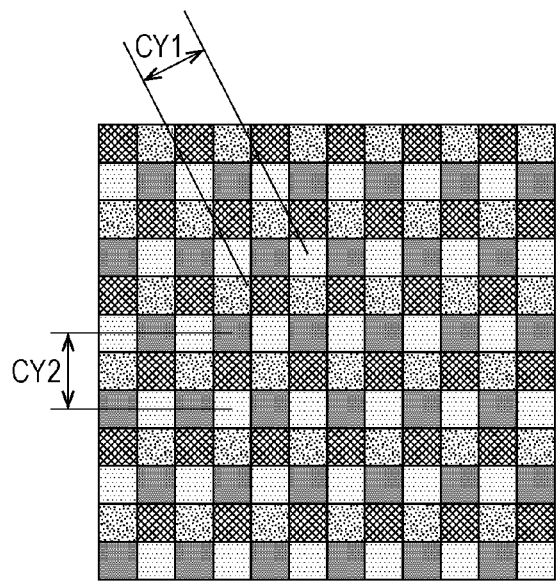
FIG. 18 is a diagram illustrating types of data voltage and selected light-emission control lines in the display device according to the third embodiment.
FIG. 19 is an enlarged diagram of an eye-tracked image in the display device according to the third embodiment.

FIG. 18 is a diagram illustrating the types of data voltage applied to the data lines during the scanning line selection interval, and the light emission control lines selected after the scanning interval of the scanning line. During the selection interval of the scanning line SL1 in the first subframe interval, R voltage and B voltage are respectively applied to the data lines DL1 and DL2, and these voltages are written to the respective pixels P(1, 1) and P(1, 2). Thereafter, the light emission control line EL1a is selected, and the transistor Qr within the pixel P(1, 1) and the transistor Qb within the pixel P(1, 2) turn on. Accordingly, the organic EL element Lr within the pixel P(1, 1) emits light of a luminescence according to the R voltage, and the organic EL element Lb within the pixel P(1, 2) emits light of a luminescence according to the B voltage.

During the selection interval of the scanning line SL2 in the first subframe interval, G voltage and D voltage are respectively applied to the data lines DL1 and DL2, and these voltages are written to the respective pixels P(2, 1) and P(2, 2). Thereafter, the light emission control line EL2a is selected, and the transistor Qg within the pixel P(2, 1) turns on. Accordingly, the organic EL element Lg within the pixel P(2, 1) emits light of a luminescence according to the G voltage. None of the organic EL elements Lr, Lg, and Lb within the pixel P(2, 2) emit light, since the transistors Qr, Qg, and Qb within the pixel P(2, 2) are off.

As a result, during the first subframe interval the display color of the pixel P(1, 1) is a color corresponding to the red video signal, the display color of the pixel P(1, 2) is a color corresponding to the blue video signal, the display color of the pixel P(2, 1) is a color corresponding to the green video signal, and the display color of the pixel P(2, 2) is black. Further, during the first subframe interval, the display color of the pixel P(3, 1) is a color corresponding to the blue video signal, the display color of the pixel P(3, 2) is a color corresponding to the red video signal, the display color of the pixel P(4, 1) is black, and the display color of the pixel P(4, 2) is a color corresponding to the green video signal.

The display device according to the present embodiment operates in the same manner as the first subframe interval in the second through fourth subframe intervals as well. Thus, the display device according to the present embodiment displays four subframes in one frame interval, following the display pattern sequence illustrated in FIG. 15.

FIG. 19 is an enlarged view of an eye-tracked image in the display device according to the present embodiment. An oblique grid point pattern occurs in the eye-tracked image illustrated in FIG. 19. A cycle CY1 at which pixels of the same color appear in the oblique direction is $4/\sqrt{5}$ times the pixel pitch. A cycle CY2 at which pixels of the same color appear in the horizontal direction also is twice the pixel pitch. Pixels of the same color do not continue in the eye-tracked image illustrated in FIG. 19, so it is difficult for the human eye to visually perceive streaks.

As described above, in the display device according to the present embodiment, the multiple pixels 11 are classified into four groups such that pixels one pixel away in the first direction (direction in which the scanning lines extend) and two pixels away in the second direction (direction in which the data lines extend) belong to the same group, in the color assignment rule (display pattern sequence). This classification and assigning of a different color to the pixels of each group, in each subframe, enables the same color to be prevented from being assigned to adjacent pixels in each subframe, so streaks occurring in the displayed image can be made to be harder to visually perceive.

Any voltage other than D voltage may be written to pixels regarding which black is assigned or no voltage has to be written to pixels regarding which black is assigned in the display device according to the present embodiment, in the same way as in the second embodiment.

Fourth Embodiment

Figure 20:
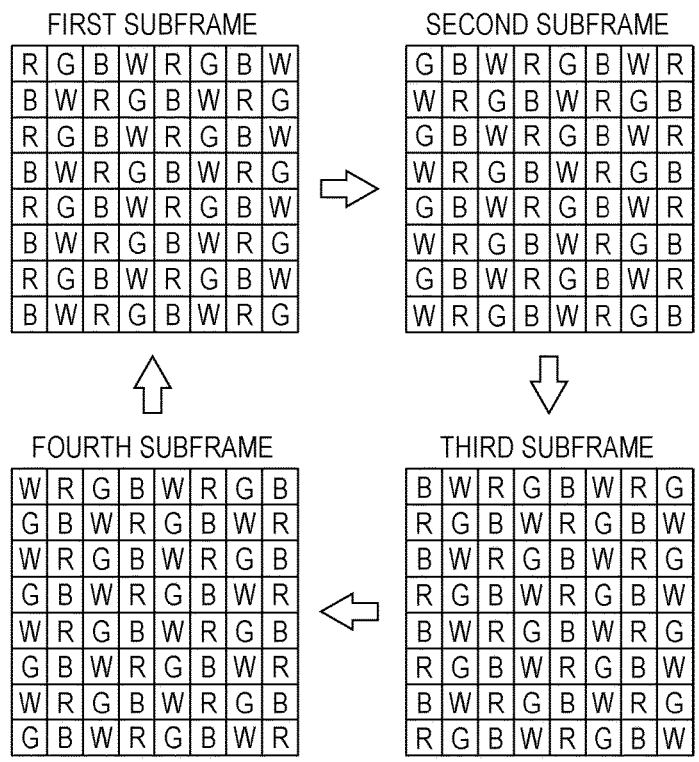
FIG. 20 is a diagram illustrating a display pattern sequence of a display device according to a fourth embodiment.
Figure 21:
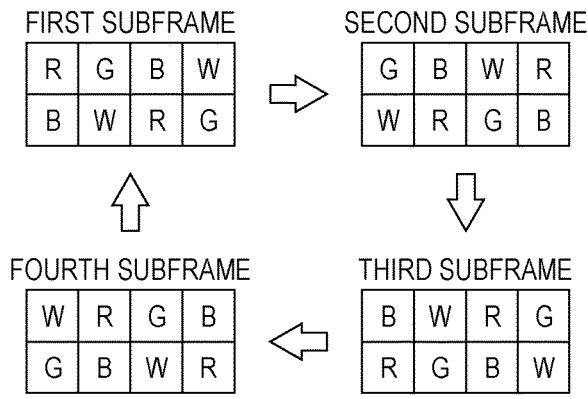
FIG. 21 is a diagram illustrating a part of FIG. 20.

FIG. 20 is a diagram illustrating a display pattern sequence of a display device according to a fourth embodiment. FIG. 21 is a diagram illustrating a part of FIG. 20. The letter W in FIG. 20 represents white. The display pattern sequence illustrated in FIG. 20 is the display pattern sequence illustrated in FIG. 9 in which black (D) has been replaced by white (W). The (m×n) pixels are classified into first through fourth groups in the present embodiment, in the same way as in the second embodiment, such that pixels two pixels away in the horizontal direction and one pixel away in the vertical direction belong to the same group. In the first subframe, red, green, blue, and white are respectively assigned to the pixels of the first through fourth groups, in the second subframe green, blue, white, and red are respectively assigned, in the third subframe blue, white, red, and green are respectively assigned, and in the fourth subframe white, red, green, and blue are respectively assigned.

Figure 22:
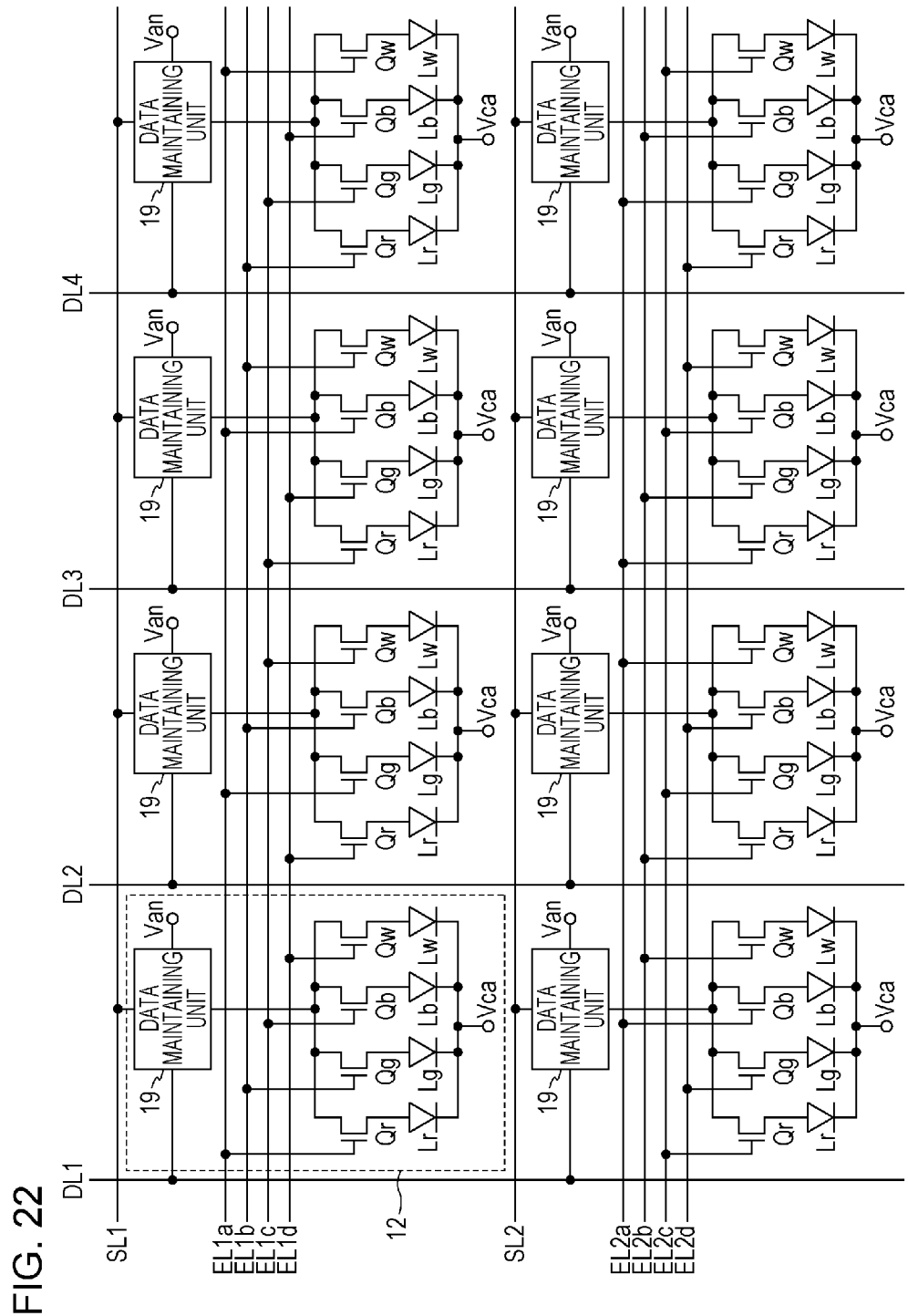
FIG. 22 is a diagram illustrating the configuration of a display unit of the display device according to the fourth embodiment.

FIG. 22 is a diagram illustrating the configuration of the display unit 2 according to the present embodiment. FIG. 22 shows the configuration of pixels P(1, 1) through P(1, 4) and P(2, 1) through P(2, 4). Other portions of the display unit 2 have the same configuration as that in FIG. 22. In the present embodiment, k=4, and pixel (i, j) corresponds to scanning line SLi, data line DLj, and four light emission control lines ELia through ELid.

A pixel 12 illustrated in FIG. 22 corresponds to the pixel 10 in FIG. 1. The pixel 12 is the pixel 11 to which an N-channel transistor Qw and an organic EL element Lw that emits white light have been added. The drain terminal of the transistor Qw is connected to the source terminal of the transistor Q2 in the data maintaining unit 19, and the source terminal of the transistor Qw is connected to the anode terminal of the organic EL element Lw. Low-level power source voltage Vca is applied to the cathode terminal of the organic EL element Lw.

The gate terminal of the transistor Qw is connected to one of the four light emission control lines ELia through ELid (fourth light emission control line) corresponding to the pixel P(i, j), in accordance with the display pattern sequence illustrated in FIG. 20. Specifically, the gate terminal of the transistor Qw in the pixel P(i, j) of the first group is connected to the light emission control line ELid. The gate terminal of the transistor Qw in the pixel P(i, j) of the second group is connected to the light emission control line ELic. The gate terminal of the transistor Qw in the pixel P(i, j) of the third group is connected to the light emission control line ELib. The gate terminal of the transistor Qw in the pixel P(i, j) of the fourth group is connected to the light emission control line ELia. The timing chart for the display device according to the present embodiment is the same as that in FIG. 12.

Figures 23, 24:
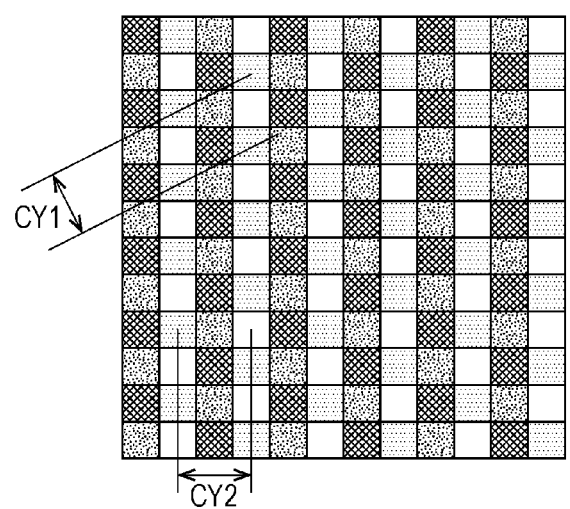
FIG. 23 is a diagram illustrating types of data voltage and selected light-emission control lines in the display device according to the fourth embodiment.
FIG. 24 is an enlarged diagram of an eye-tracked image in the display device according to the fourth embodiment.

FIG. 23 is a diagram illustrating the types of data voltage applied to the data lines during the scanning line selection interval, and the light emission control lines selected after the selection interval of the scanning line. During the selection interval of the scanning line SL1 in the first subframe interval, R voltage, G voltage, B voltage, and W voltage are respectively applied to the data lines DL1 through DL4, and these voltages are written to the respective pixels P(1, 1) through P(1, 4). Note however, that the W voltage is data voltage corresponding to a white video signal. Thereafter, the light emission control line EL1a is selected, and the transistor Qr within the pixel P(1, 1) the transistor Qg within the pixel P(1, 2), the transistor Qb within the pixel P(1, 3), and the transistor Qw within the pixel P(1, 4), turn on. Accordingly, the organic EL element Lr within the pixel P(1, 1) emits light of a luminescence according to the R voltage, the organic EL element Lg within the pixel P(1, 2) emits light of a luminescence according to the G voltage, the organic EL element Lb within the pixel P(1, 3) emits light of a luminescence according to the B voltage, and the organic EL element Lw within the pixel P(1, 4) emits light of a luminescence according to the W voltage.

During the selection interval of the scanning line SL2 in the first subframe interval, B voltage, W voltage, R voltage, and G voltage are respectively applied to the data lines DL1 through DL4, and these voltages are written to the respective pixels P(2, 1) through (2, 4). Thereafter, the light emission control line EL2a is selected, and the transistor Qb within the pixel P(2, 1) the transistor Qw within the pixel P(2, 2), the transistor Qr within the pixel P(2, 3), and the transistor Qg within the pixel P(2, 4), turn on. Accordingly, the organic EL element Lb within the pixel P(2, 1) emits light of a luminescence according to the B voltage, the organic EL element Lw within the pixel P(2, 2) emits light of a luminescence according to the W voltage, the organic EL element Lr within the pixel P(2, 3) emits light of a luminescence according to the R voltage, and the organic EL element Lg within the pixel P(2, 4) emits light of a luminescence according to the G voltage.

As a result, during the first subframe interval the display color of the pixels P(1, 1) and P(2, 3) is a color corresponding to the red video signal, the display color of the pixels P(1, 2) and P(2, 4) is a color corresponding to the green video signal, the display color of the pixels P(1, 3) and P(2, 1) is a color corresponding to the blue video signal, and the display color of the pixels P(1, 4) and P(2, 2) is a color corresponding to the white video signal (a color in the range of black to white).

The display device according to the present embodiment operates in the same manner as the first subframe interval in the second through fourth subframe intervals as well. Thus, the display device according to the present embodiment displays four subframes in one frame interval, following the display pattern sequence illustrated in FIG. 20.

FIG. 24 is an enlarged view of an eye-tracked image in the display device according to the present embodiment. An oblique grid point pattern occurs in the eye-tracked image illustrated in FIG. 24. A cycle CY1 at which pixels of the same color appear in the vertical direction is $4/\sqrt{5}$ times the pixel pitch. A cycle CY2 at which pixels of the same color appear in the horizontal direction also is twice the pixel pitch. Pixels of the same color do not continue in the eye-tracked image illustrated in FIG. 24, so it is difficult for the human eye to visually perceive streaks. Also, shades close to white are separated in the eye-tracked image in FIG. 24, so a display that is more natural than that in the second embodiment can be made.

As described above, the pixel 12 of the display device according to the present embodiment further includes a fourth light-emitting element (organic EL element Lw) that emits light of a fourth color (white), and a fourth light emission control transistor (transistor Qw) disposed between the data maintaining unit 19 and fourth light-emitting element and having a control terminal (gate terminal) connected to, of the corresponding light emission control lines ELia through ELid, a fourth light emission control line corresponding to the color assignment rule (display pattern sequence). Using this pixel including the fourth light-emitting element and fourth light emission control transistor enables pixels to which the fourth color has been assigned, to be controlled to a color corresponding to the fourth color video signals (a color corresponding to white video signals).

Figure 25:
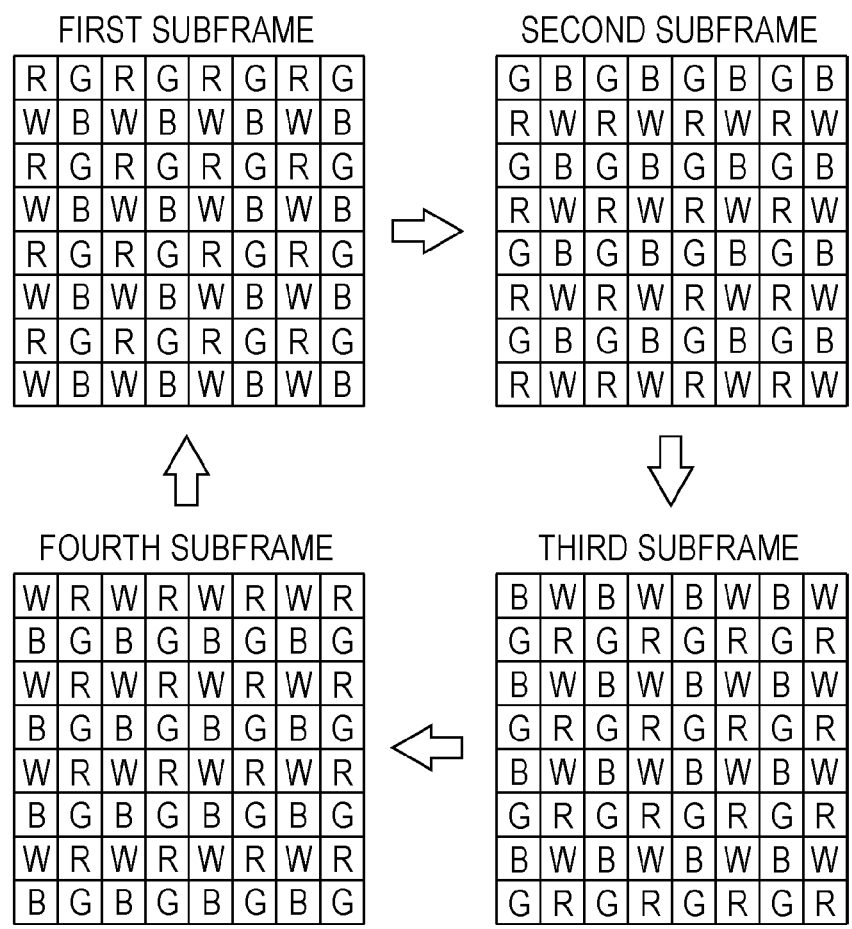
FIG. 25 is a diagram illustrating a display pattern sequence of a display device according to a first modification of the fourth embodiment.
Figure 26:
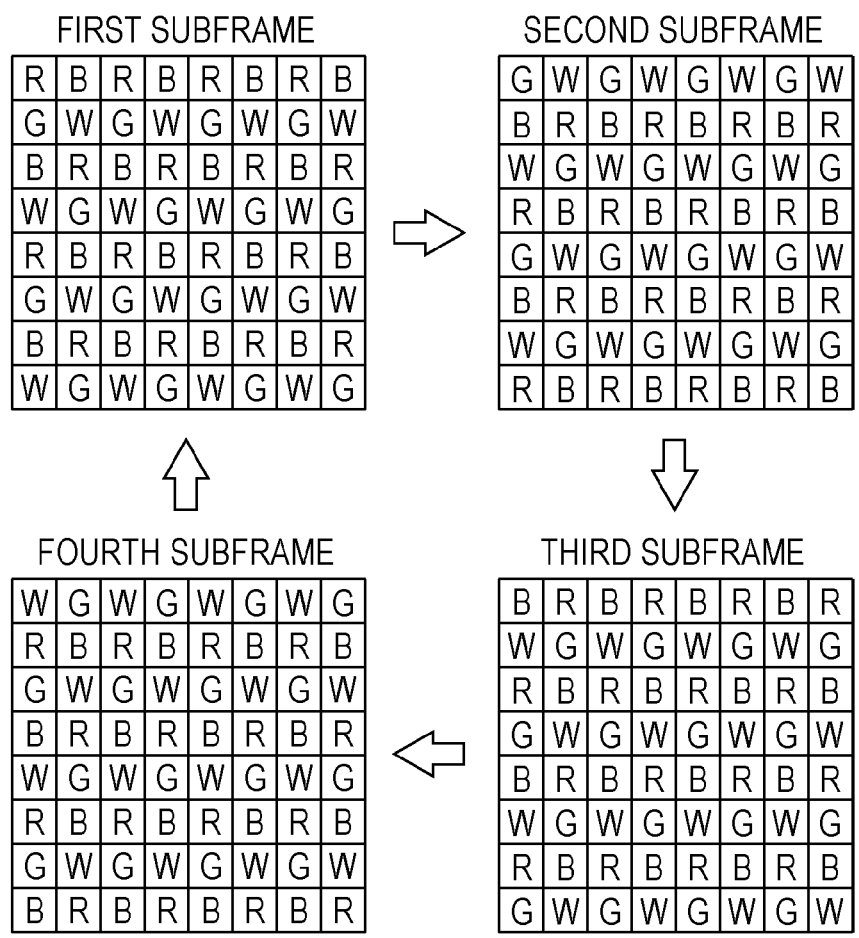
FIG. 26 is a diagram illustrating a display pattern sequence of a display device according to a second modification of the fourth embodiment.
Figure 27:
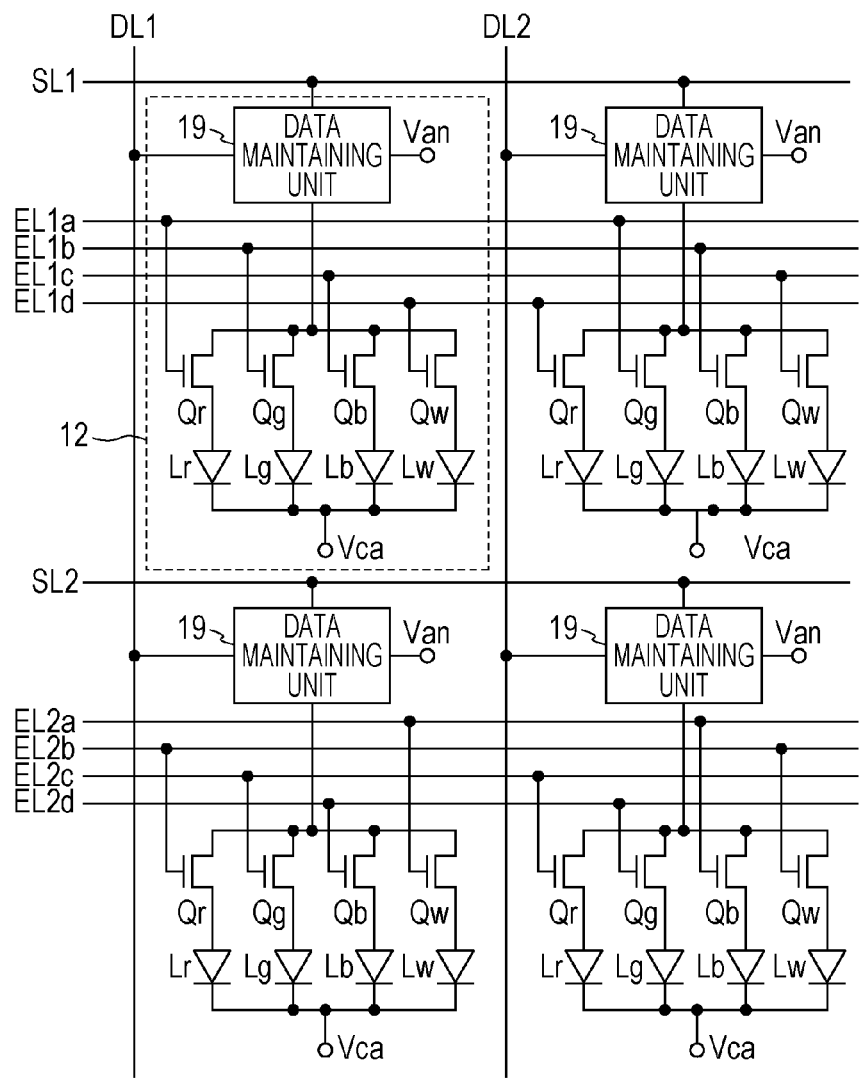
FIG. 27 is a diagram illustrating the configuration of a display unit of the display device according to the first modification of the fourth embodiment.
Figure 28:
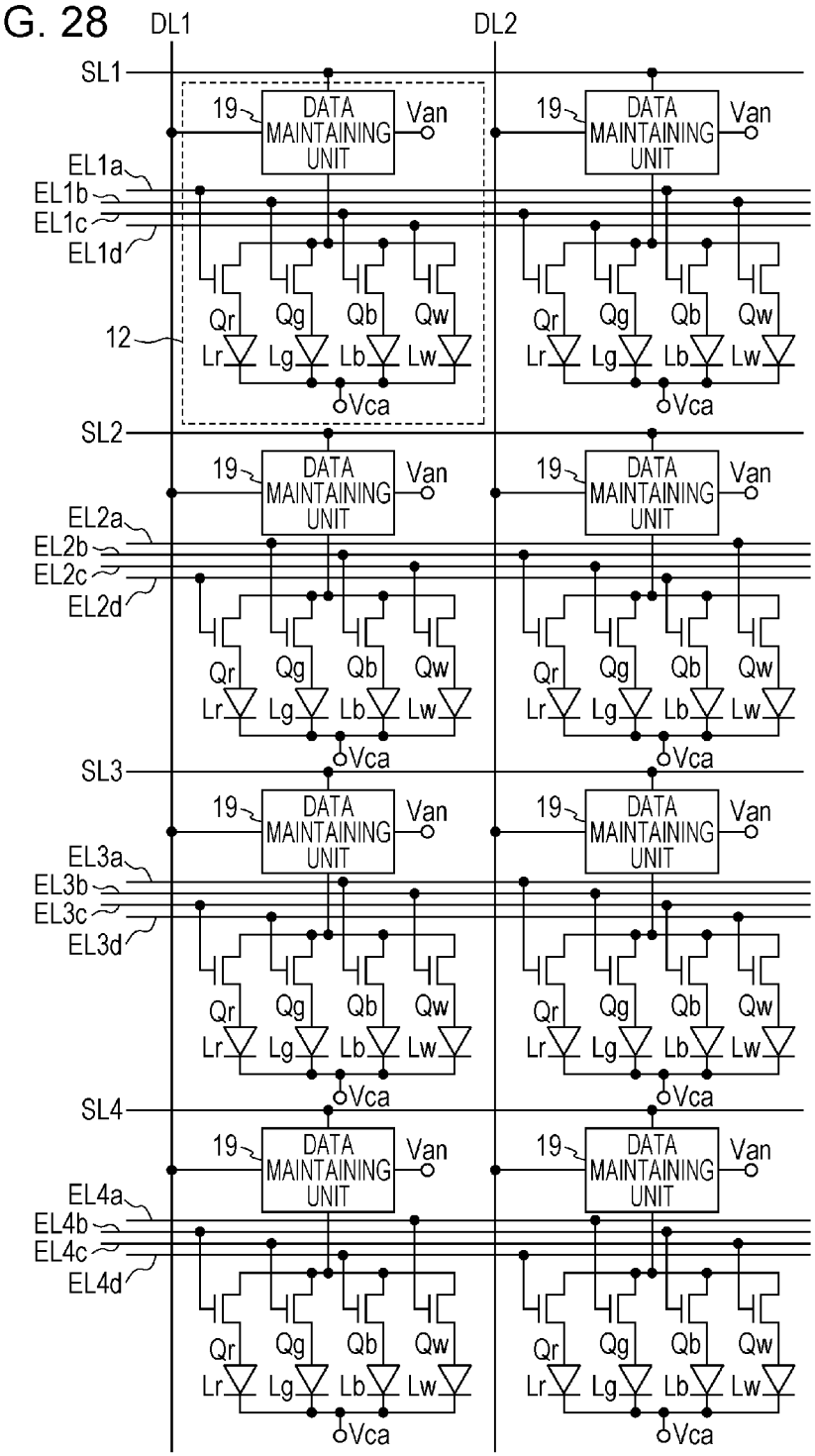
FIG. 28 is a diagram illustrating the configuration of a display unit of the display device according to the second modification of the fourth embodiment.

A display device that operates following display pattern sequences illustrated in FIGS. 25 and 26 can be configured as modifications of the fourth embodiment. The display pattern sequences illustrated in FIGS. 25 and 26 are arrangements where black has been replaced by white in the display pattern sequences illustrated in FIGS. 2 and 15, respectively. In a display device according to a first modification, the (m×n) pixels are classified into four groups, such that pixels two pixels away in the horizontal direction and two pixels away in the vertical direction belong to the same group (FIG. 25). The colors assigned to the pixels of each group in each subframe are the same as in the fourth embodiment. The configuration of the display unit of the display device according to the first modification is as illustrated in FIG. 27. In a display device according to a second modification, the (m×n) pixels are classified into four groups, such that pixels one pixel away in the horizontal direction and two pixels away in the vertical direction belong to the same group (FIG. 26). The colors assigned to the pixels of each group in each subframe are the same as in the fourth embodiment. The configuration of the display unit of the display device according to the first modification is as illustrated in FIG. 28. The operations of the display devices according to these modifications are the same as the display device according to the fourth embodiment, so description will be omitted here.

Fifth Embodiment

Figure 29:
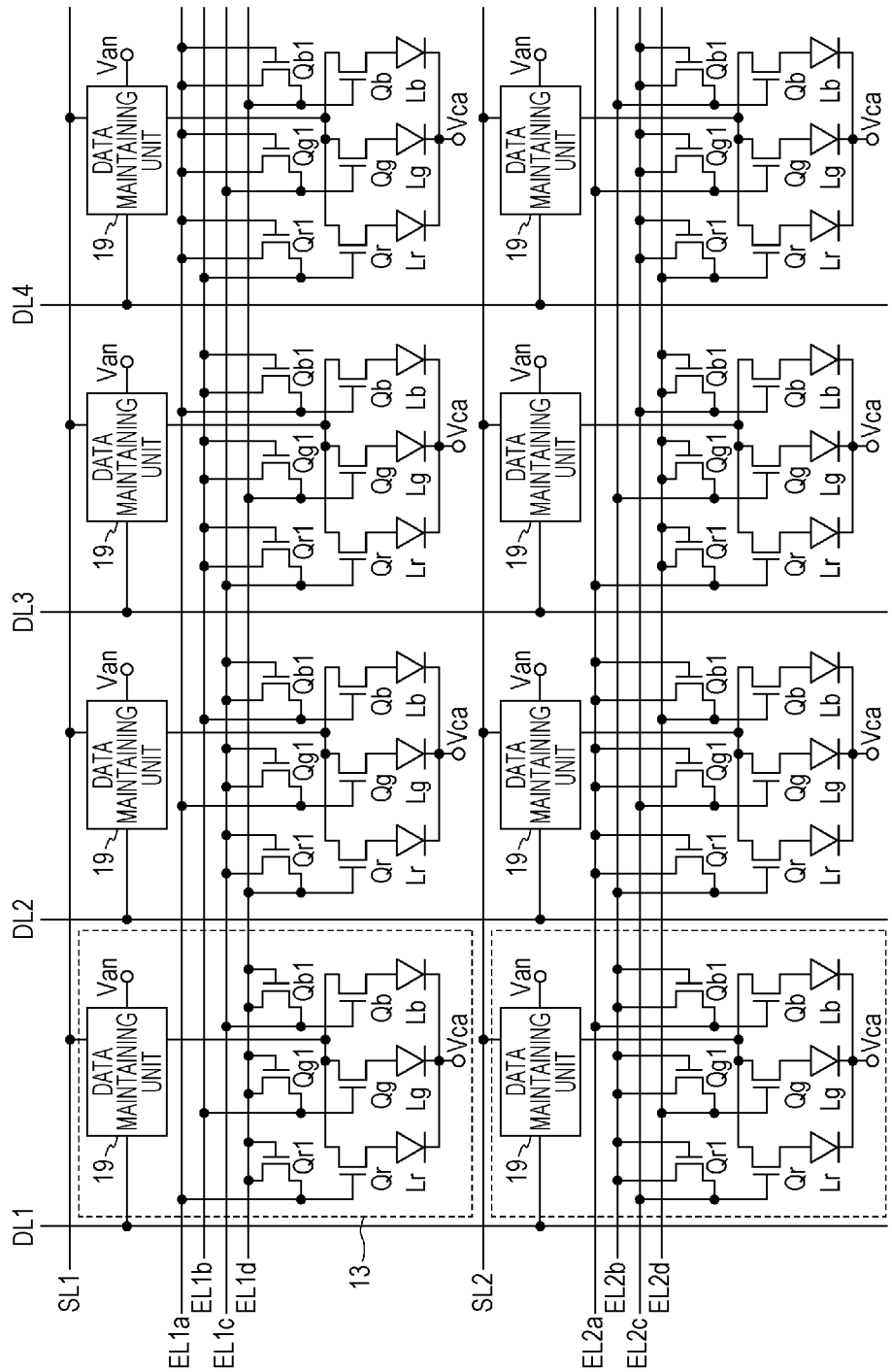
FIG. 29 is a diagram illustrating the configuration of a display unit of a display device according to a fifth embodiment.

A display device according to a fifth embodiment of the present invention operates following the display pattern sequence illustrated in FIG. 20. FIG. 29 is a diagram illustrating a display unit of the display device according to the present embodiment. A pixel 13 illustrated in FIG. 29 corresponds to the pixel 10 in FIG. 1. The pixel 13 is the pixel 11 to which three N-channel transistors Qr1, Qg1, and Qb1 have been added. The source terminals of the transistors Qr1, Qg1, and Qb1 are respectively connected to the gate terminals of the transistors Qr, Qg, and Qb.

The drain terminals and gate terminals of the transistors Qr1, Qg1, and Qb1 are connected to one of the four light emission control lines ELia through ELid (fourth light emission control line) corresponding to the pixel P(i, j), in accordance with the display pattern sequence illustrated in FIG. 20. Specifically, the drain terminals and gate terminals of the transistors Qr1, Qg1, and Qb1 in the pixel P(i, j) of the first group are connected to the light emission control line ELid. The drain terminals and gate terminals of the transistors Qr1, Qg1, and Qb1 in the pixel P(i, j) of the second group are connected to the light emission control line ELic. The drain terminals and gate terminals of the transistors Qr1, Qg1, and Qb1 in the pixel P(i, j) of the third group are connected to the light emission control line ELib. The drain terminals and gate terminals of the transistors Qr1, Qg1, and Qb1 in the pixel P(i, j) of the fourth group are connected to the light emission control line ELia. When selection voltage is applied to the fourth light emission control line, of the light emission control lines ELia through ELid, in accordance with the display pattern sequence, the transistors Qr1, Qg1, and Qb1 function as a total-emission control circuit to electrically connect between the data maintaining unit 19 and the organic EL elements Le, Lg, and Lb, respectively. The timing chart for the display device according to the present embodiment is the same as that in FIG. 12.

During the selection interval of the scanning line SL1 in the first subframe interval, R voltage, G voltage, B voltage, and W voltage are respectively applied to the data lines DL1 through DL4, and these voltages are written to the respective pixels P(1, 1) through (1, 4). Thereafter, the light emission control line EL1a is selected, and the transistor Qr within the pixel P(1, 1) the transistor Qg within the pixel P(1, 2), and the transistor Qb within the pixel P(1, 3), turn on. Accordingly, the organic EL element Lr within the pixel P(1, 1) emits light of a luminescence according to the R voltage, the organic EL element Lg within the pixel P(1, 2) emits light of a luminescence according to the G voltage, and the organic EL element Lb within the pixel P(1, 3) emits light of a luminescence according to the B voltage. At this time, the transistors Qr1, Qg1, and Qb1 in the pixel P(1, 4) turn on, and high-level voltage is applied to the gate terminals of the transistors Qr, Qg, and Qb, so the transistors Qr, Qg, and Qb turn on. Accordingly, the organic EL elements Lr, Lg, and Lb within the pixel P(1, 4) emit light of a luminescence according to the W voltage.

As a result, during the first subframe interval the display color of the pixel P(1, 1) is a color corresponding to the red video signal, the display color of the pixel P(1, 2) is a color corresponding to the green video signal, and the display color of the pixel P(1, 3) is a color corresponding to the blue video signal. Also, blending red and green and blue yields white, so the display color of the pixel P(1, 4) is a color corresponding to the white video signal.

As described above, the pixel 13 of the display device according to the present embodiment includes, as a full-emission control circuit, the three transistors (transistors Qr1, Qg1, and Qb1) of which the control terminals (gate terminals) and one conducting terminals (drain terminals) are connected to the fourth light emission control line, and other conducting terminals (source terminals) are respectively connected to the control terminals of the first through third light emission control transistors (gate terminals of the transistors Qr, Qg, and Qb).

In a case where the fourth color (white) is yielded by blending the first through third colors (red, green, and blue), pixels to which the fourth color has been assigned to can be controlled to a color corresponding to the fourth color video signals (a color corresponding to white video signals) by using a pixel including the full-emission control circuit. The full-emission control circuit can be configured by providing three transistors of which the control terminals and one conducting terminals are connected to the fourth light emission control line, and other conducting terminals of the three transistors are respectively connected to the control terminals of three light emission control transistors.

Figure 30:
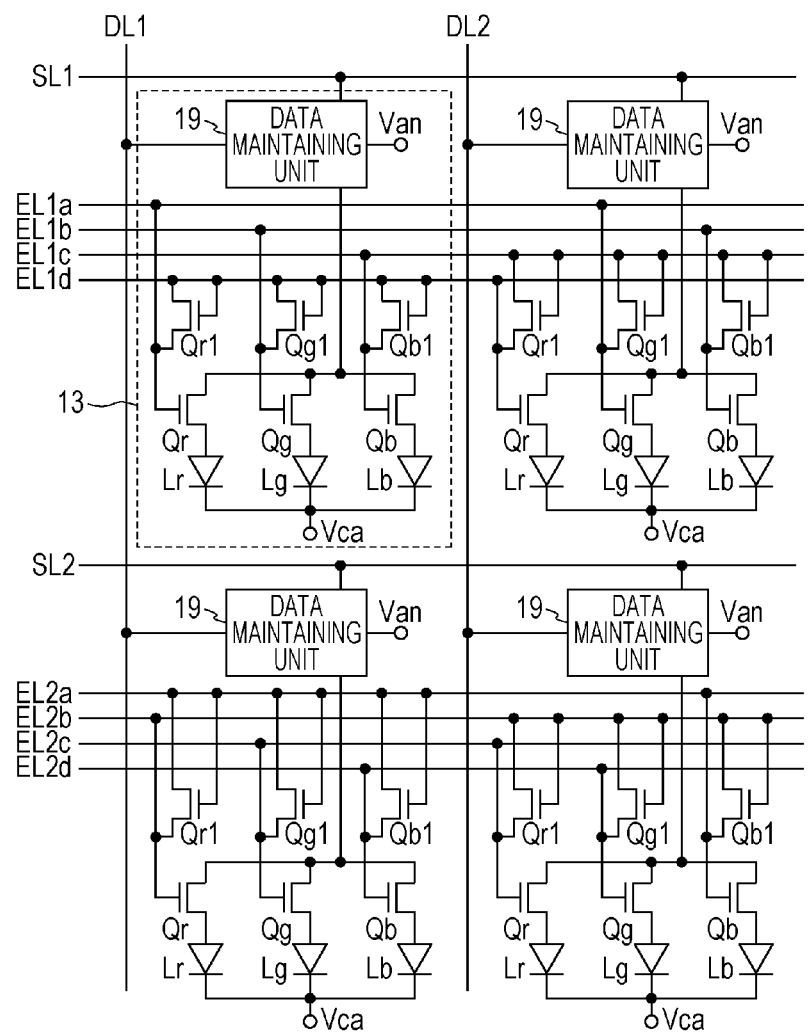
FIG. 30 is a diagram illustrating the configuration of a display unit of a display device according to a first modification of the fifth embodiment.
Figure 31:
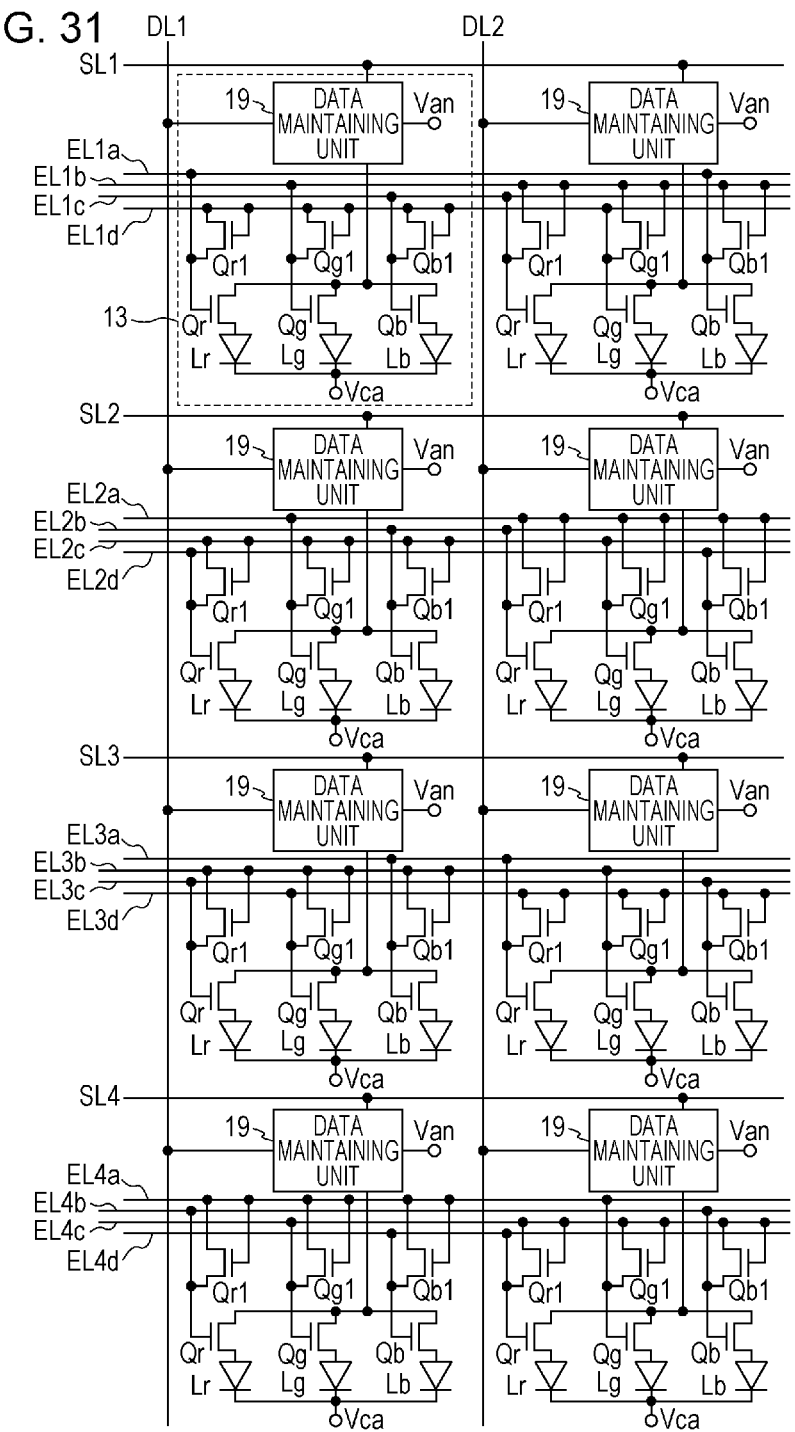
FIG. 31 is a diagram illustrating the configuration of a display unit of the display device according to a second modification of the fifth embodiment.

A display device that operates following display pattern sequences illustrated in FIGS. 25 and 26 can be configured as modifications of the fifth embodiment. The configuration of the display unit of the display device according to the first modification is as illustrated in FIG. 30. The configuration of the display unit of the display device according to the second modification is as illustrated in FIG. 31. The operations of the display devices according to these modifications are the same as the display device according to the fifth embodiment, so description will be omitted here.

Sixth Embodiment

Figure 32:
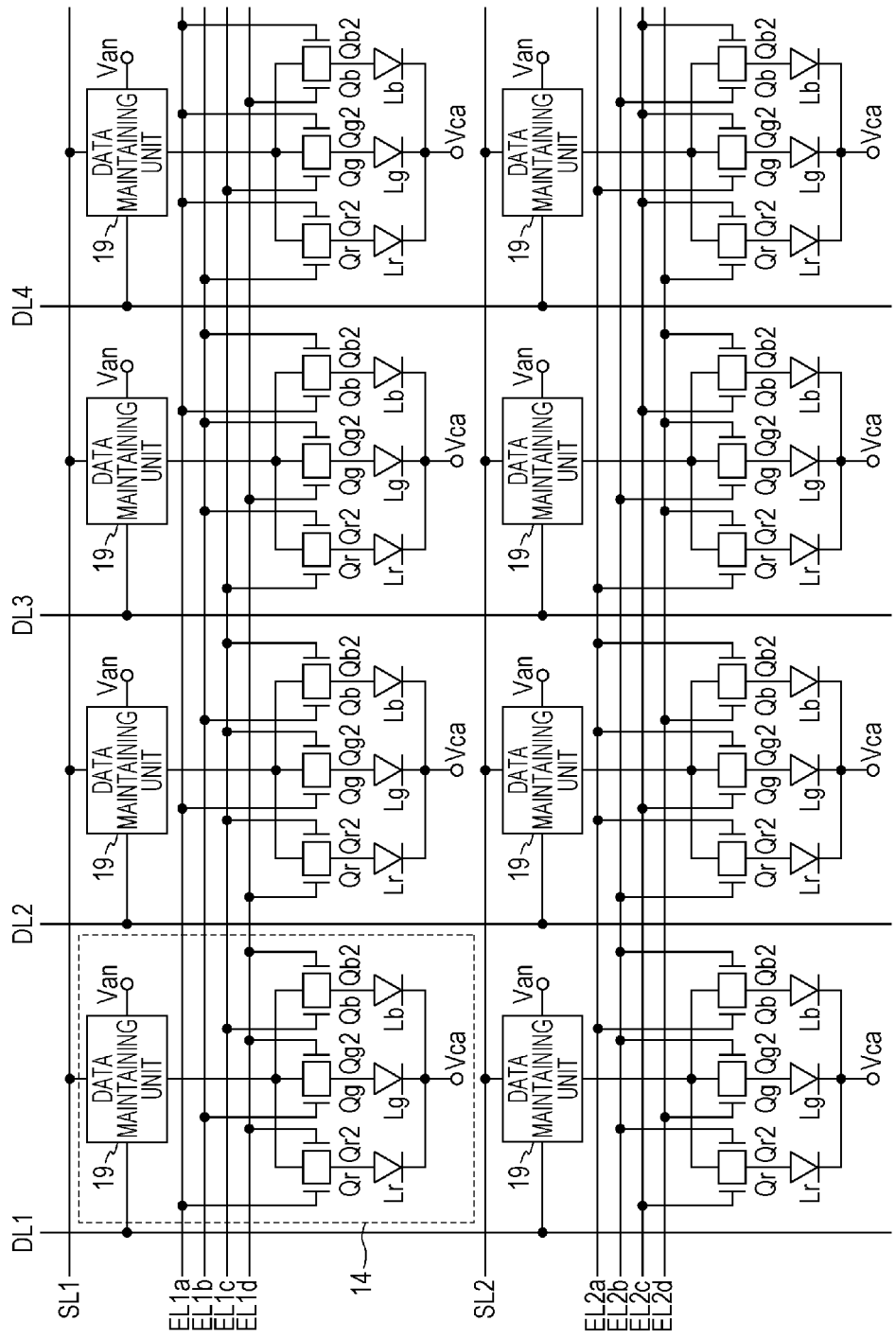
FIG. 32 is a diagram illustrating the configuration of a display unit of a display device according to a sixth embodiment.

A display device according to a sixth embodiment of the present invention operates following the display pattern sequence illustrated in FIG. 20. FIG. 32 is a diagram illustrating a display unit of the display device according to the present embodiment. A pixel 14 illustrated in FIG. 32 corresponds to the pixel 10 in FIG. 1. The pixel 14 is the pixel 11 to which three N-channel transistors Qr2, Qg2, and Qb2 have been added. The transistors Qr2, Qg2, and Qb2 are disposed in parallel with the transistors Qr, Qg, and Qb, between the data maintaining unit 19 and organic EL elements Lr, Lg, and Lb, respectively. Specifically, the train terminals of the transistors Qr2, Qg2, and Qb2 are respectively connected to the drain terminals of the transistors Qr, Qg, and Qb. The source terminals of the transistors Qr2, Qg2, and Qb2 are respectively connected to the source terminals of the transistors Qr, Qg, and Qb.

The gate terminals of the transistors Qr2, Qg2, and Qb2 are connected to one of the four light emission control lines ELia through ELid (fourth light emission control line) corresponding to the pixel P(i, j), in accordance with the display pattern sequence illustrated in FIG. 20. Specifically, the gate terminals of the transistors Qr2, Qg2, and Qb2 in the pixel P(i, j) of the first group are connected to the light emission control line ELid. The gate terminals of the transistors Qr2, Qg2, and Qb2 in the pixel P(i, j) of the second group are connected to the light emission control line ELic. The gate terminals of the transistors Qr2, Qg2, and Qb2 in the pixel P(i, j) of the third group are connected to the light emission control line ELib. The gate terminals of the transistors Qr2, Qg2, and Qb2 in the pixel P(i, j) of the fourth group are connected to the light emission control line ELia. The transistors Qr2, Qg2, and Qb2 function as a full-emission control circuit, in the same way as the transistors Qr1, Qg1, and Qb1 in the pixel 13. The timing chart for the display device according to the present embodiment is the same as that in FIG. 12.

During the selection interval of the scanning line SL1 in the first subframe interval, R voltage, G voltage, B voltage, and W voltage are respectively applied to the data lines DL1 through DL4, and these voltages are written to the respective pixels P(1, 1) through (1, 4). Thereafter, the light emission control line EL1a is selected, and the transistor Qr within the pixel P(1, 1) the transistor Qg within the pixel P(1, 2), the transistor Qb within the pixel P(1, 3), and the transistors Qr2, Qg2, and Qb2 within the pixel P(1, 4), turn on. Accordingly, the organic EL element Lr within the pixel P(1, 1) emits light of a luminescence according to the R voltage, the organic EL element Lg within the pixel P(1, 2) emits light of a luminescence according to the G voltage, the organic EL element Lb within the pixel P(1, 3) emits light of a luminescence according to the B voltage and the organic EL elements Lr, Lg, and Lb within the pixel P(1, 4) emit light of a luminescence according to the W voltage.

As a result, during the first subframe interval the display color of the pixel P(1, 1) is a color corresponding to the red video signal, the display color of the pixel P(1, 2) is a color corresponding to the green video signal, the display color of the pixel P(1, 3) is a color corresponding to the blue video signal. Also, blending red and green and blue yields white, so the display color of the pixel P(1, 4) is a color corresponding to the white video signal.

As described above, the pixel 14 of the display device according to the present embodiment includes, as a full-emission control circuit, the three transistors (transistors Qr2, Qg2, and Qb2) provided in parallel with the first through third light emission control transistors (transistors Qr, Qg, and Qb) between the data maintaining unit 19 and the first through third light-emitting elements (organic EL elements Lr, Lg, and Lb) respectively, having control terminals (gate terminals) connected to the fourth light emission control line.

In a case where the fourth color (white) is yielded by blending the first through third colors (red, green, and blue), pixels to which the fourth color has been assigned to can be controlled to a color corresponding to the fourth color video signals (a color corresponding to white video signals) by using a pixel including the full-emission control circuit. The full-emission control circuit can be configured by providing three transistors in parallel to the three light emission control transistors, and connecting the control terminals of the three transistors to the fourth light emission control line.

Figure 33:
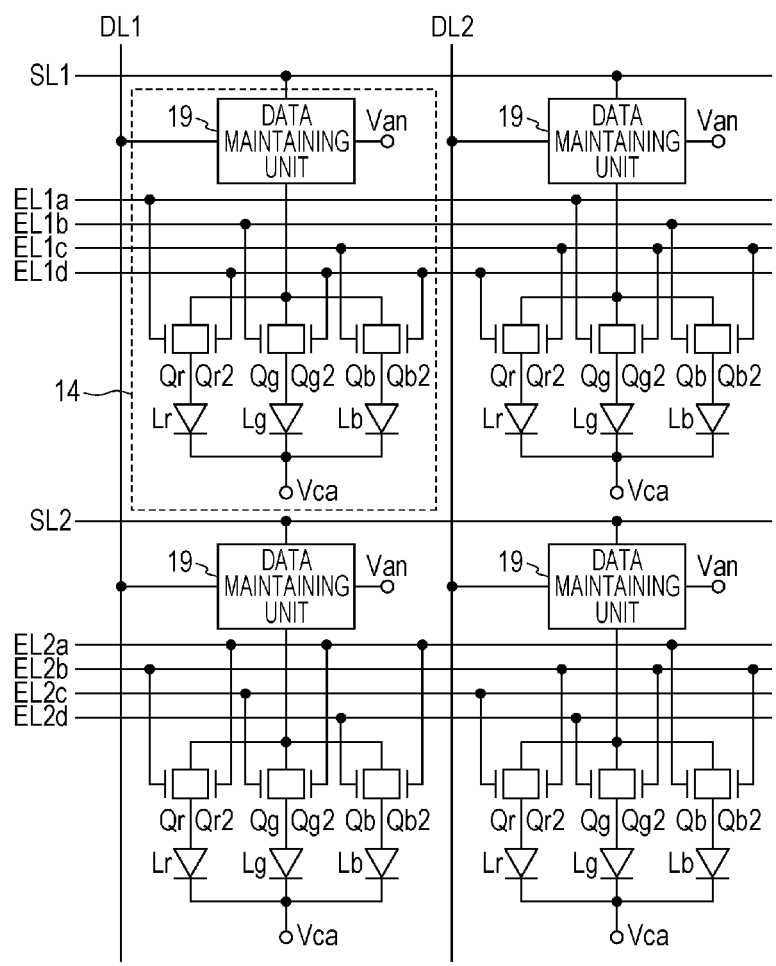
FIG. 33 is a diagram illustrating the configuration of a display unit of a display device according to a first modification of the sixth embodiment.
Figure 34:
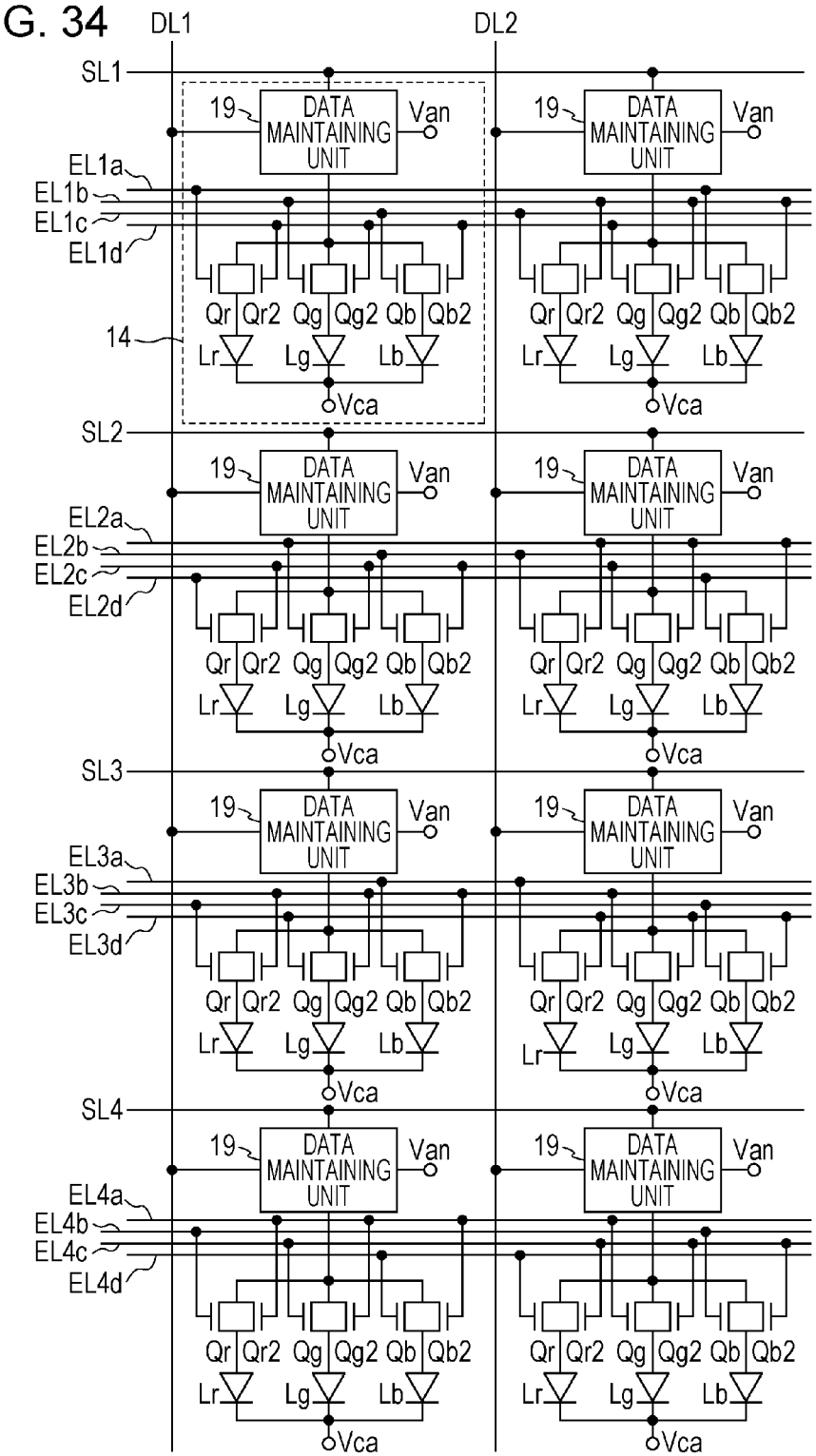
FIG. 34 is a diagram illustrating the configuration of a display unit of the display device according to a second modification of the sixth embodiment.

A display device that operates following display pattern sequences illustrated in FIGS. 25 and 26 can be configured as modifications of the sixth embodiment. The configuration of the display unit of the display device according to the first modification is as illustrated in FIG. 33. The configuration of the display unit of the display device according to the second modification is as illustrated in FIG. 34. The operations of the display devices according to these modifications are the same as the display device according to the sixth embodiment, so description will be omitted here.

While description has been made above regarding the display pattern sequence that red, green, and blue are respectively assigned to pixels of the first through third groups in the first subframe, any colors of red, green, and blue that are different from each other may be assigned to pixel of the first through third groups in the first subframe. Also, while description has been made above regarding the display pattern sequence that black or white is assigned to pixels of the first group in the first subframe, a color other than black and white (e.g., magenta or cyan) may be assigned to pixels of the fourth group in the first subframe.

Features common to the above-described display devices will be described. In the display pattern sequence illustrated in FIG. 2 and FIG. 25, the multiple pixels are classified into four groups such that pixels two pixels away in the horizontal direction and two pixels away in the vertical direction belong to the same group (hereinafter referred to as classification A). In the display pattern sequence illustrated in FIG. 9 and FIG. 20, the multiple pixels are classified into four groups such that pixels two pixels away in the horizontal direction and one pixel away in the vertical direction belong to the same group (hereinafter referred to as classification B). In the display pattern sequence illustrated in FIG. 15 and FIG. 26, the multiple pixels are classified into four groups such that pixels one pixel away in the horizontal direction and two pixels away in the vertical direction belong to the same group (hereinafter referred to as classification C). Classifications A through C satisfy a condition that "groups to which the pixels belong are different from all groups to which pixels belong that are adjacent in eight directions" (hereinafter referred to as first condition) and "pixels adjacent in 8 directions to pixels belonging to the same group, are of the same groups" (hereinafter referred to as second condition).

Figure 35:
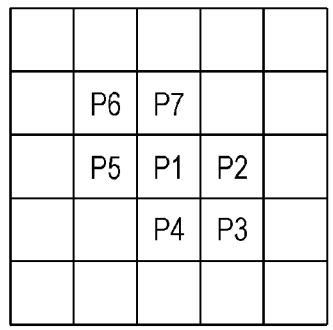
FIG. 35 is a diagram for describing a method to decide a display pattern sequence for a display device according to an embodiment of the present invention.
Figure 36:
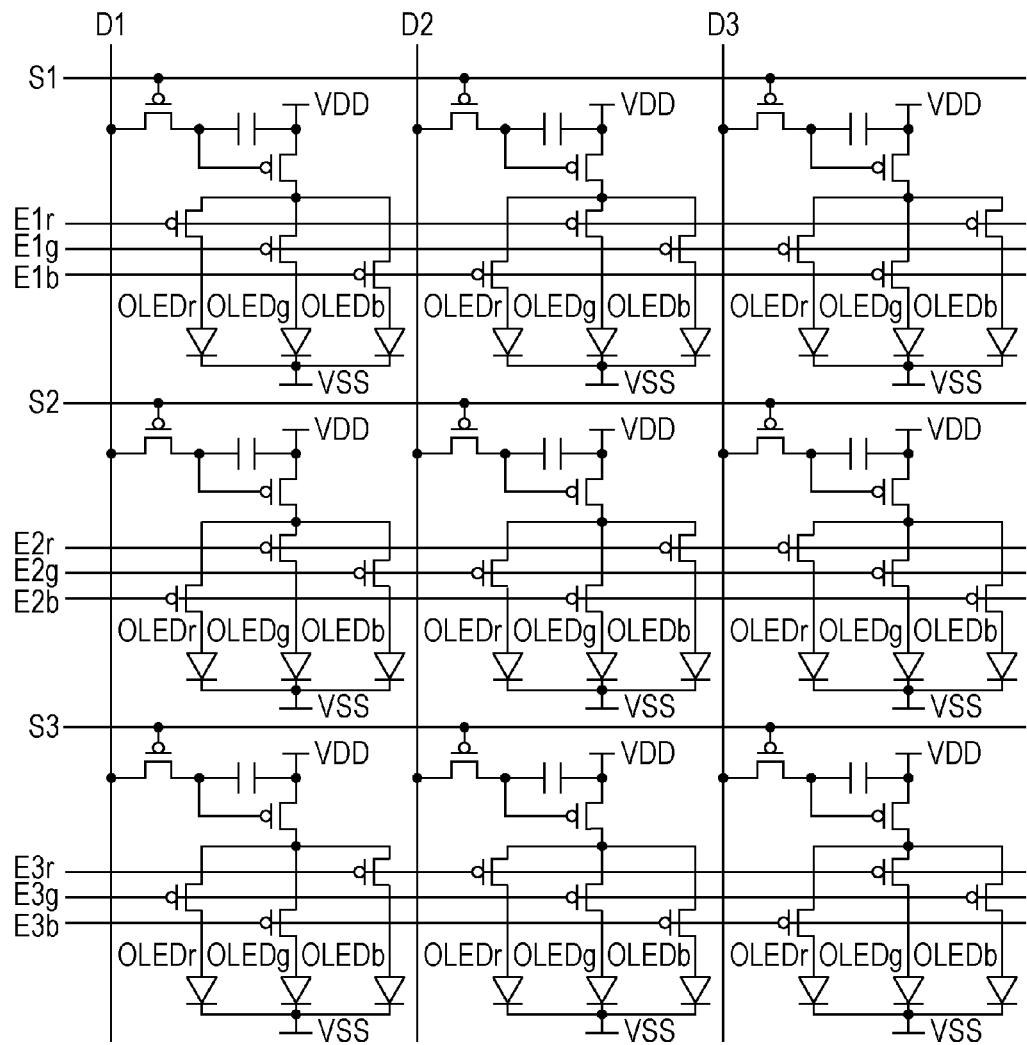
FIG. 36 is a circuit diagram of a pixel matrix in a conventional display device.
Figure 37:
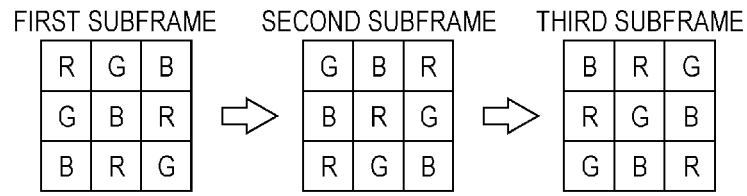
FIG. 37 is a diagram illustrating a display pattern sequence of a conventional display device.

Although there are many classifications whereby multiple pixels that are laid out two-dimensionally can be classified into four groups, Classifications A through C are the only ones that satisfy the first and second conditions. The reason will be described with reference to FIG. 35. In FIG. 35, each square represents one pixel. In order to satisfy the first condition, the adjacent pixels P1 through P4 need to be classified into four differ groups. For the same reason, pixels P1 and P5 through 7 also need to be classified into four differ groups. Accordingly, one of the pixels P5 through P7 needs to be classified into the same group as pixel P3. The only classification whereby the pixel P5 is classified into the same group as pixel P3 and the second condition is satisfied, is Classification B. The only classification whereby the pixel P6 is classified into the same group as pixel P3 and the second condition is satisfied, is Classification A. The only classification whereby the pixel P7 is classified into the same group as pixel P3 and the second condition is satisfied, is Classification C.

The multiple pixels are classified into first through fourth groups so as to satisfy the first and second conditions in the display device according to the present invention. Operation is performed following a display pattern sequence in which the first through fourth colors are respectively assigned to the first through fourth groups in the first subframe, the second through fourth and first colors are respectively assigned in the second subframe, the third, fourth, first, and second colors are respectively assigned in the third subframe, and the fourth and first through third colors are respectively assigned in the fourth subframe. The display device according to the present embodiment enables color breakup occurring in displayed images to be harder to visually perceive, by assigning one of four colors to each of the pixels in each of the subframes, and displaying four subframes in one frame interval, as compared to a case where three subframes are displayed in one frame interval. Also, the multiple pixels are classified into four groups so as to satisfy the first and second conditions, and a different color is assigned to the pixels of each group, in each subframe, whereby the same color is prevented from being assigned to adjacent pixels in each subframe, enabling streaks occurring in the displayed image to be harder to visually perceive.

INDUSTRIAL APPLICABILITY

It is a feature of the display device according to the present invention that streaks occurring in displayed images are not readily visually perceived, and accordingly the display device according to the present invention is applicable to display units and the like of various types of electronic devices.

REFERENCE SIGNS LIST 1 display device
2 display unit
3 display control circuit
4 scanning line drive circuit
5 data line drive circuit
6 light emission control line drive circuit
10, 11, 12, 13, 14 pixels
19 data maintaining unit

The invention claimed is:
1. A display device configured to display a plurality of subframes in one frame interval, the display device comprising:
a display unit including a plurality of pixels laid out arrayed in a first and a second direction; and
drive circuits configured to drive the display unit following a color assignation rule,
wherein the color assignation rule is a rule that one of a first through a fourth color is assigned to each of the plurality of pixels in a first through a fourth subframe,
and wherein, in the color assignation rule, the plurality of pixels are classified into first through fourth groups such that
groups to which the pixels belong are different from all groups to which pixels belong that are adjacent in eight directions, and
pixels adjacent in 8 directions to pixels belonging to the same group, are of the same groups,
and the first through fourth colors are respectively assigned to the pixels of the first through fourth groups in the first subframe, the second through fourth and first colors are respectively assigned in the second subframe, the third, fourth, first, and second colors are respectively assigned in the third subframe, and the fourth and first through third colors are respectively assigned in the fourth subframe,
wherein the display unit further includes
a plurality of scanning lines,
a plurality of data lines, and
a plurality of light emission control lines,
wherein the drive circuits include
a scanning line drive circuit configured to select the plurality of scanning lines in order in each subframe interval,
a data line drive circuit configured to apply, to the plurality of data lines, voltage that corresponds to a video signal in each line interval in each subframe interval following the color assignation rule, and
a light emission control line drive circuit configured to drive the plurality of light emission control lines in each subframe interval following the color assignation rule,
wherein the pixels include
a data maintaining unit corresponding to one scanning line, one data line, and three or four light emission control lines, and holding voltage applied to a data line corresponding to a selection period of a corresponding scanning line,
first through third light-emitting elements configured to emit light of the first through third colors, and
first through third light emission control transistors provided between the data maintaining unit and the first through third light-emitting elements, having control terminals connected to a light emission control line of corresponding light emission control lines in accordance with the color assignation rule,
wherein the pixels further include
a full-emission control circuit configured to electrically connect between the data maintaining unit and the first through third light-emitting elements when selection voltage is applied to the fourth light emission control line corresponding to the fourth color, of the four corresponding light emission control lines,
wherein the full-emission control circuit further includes three transistors of which control terminals and one conducting terminals are connected to the fourth light emission control line, and other conducting terminals are respectively connected to the control terminals of the first through third light emission control transistors.

2. The display device according to claim 1, wherein, in the color assignation rule, the plurality of pixels are classified into the first through fourth groups such that pixels two pixels away in the first direction and two pixels away in the second direction belong to the same group.

3. The display device according to claim 1, wherein, in the color assignation rule, the plurality of pixels are classified into the first through fourth groups such that pixels two pixels away in the first direction and one pixel away in the second direction belong to the same group.

4. The display device according to claim 1, wherein, in the color assignation rule, the plurality of pixels are classified into the first through fourth groups such that pixels one pixel away in the first direction and two pixels away in the second direction belong to the same group.

5. The display device according to claim 1, wherein the first through third colors are one of red, green, and blue, and the fourth color is black.

6. The display device according to claim 1, wherein the first through third colors are one of red, green, and blue, and the fourth color is white.

7. A display device configured to display a plurality of subframes in one frame interval, the display device comprising:
   a display unit including a plurality of pixels laid out arrayed in a first and a second direction; and
   drive circuits configured to drive the display unit following a color assignation rule,
   wherein the color assignation rule is a rule that one of a first through a fourth color is assigned to each of the plurality of pixels in a first through a fourth subframe,
   and wherein, in the color assignation rule, the plurality of pixels are classified into first through fourth groups such that
      groups to which the pixels belong are different from all groups to which pixels belong that are adjacent in eight directions, and
      pixels adjacent in 8 directions to pixels belonging to the same group, are of the same groups,
   and the first through fourth colors are respectively assigned to the pixels of the first through fourth groups in the first subframe, the second through fourth and first colors are respectively assigned in the second subframe, the third, fourth, first, and second colors are respectively assigned in the third subframe, and the fourth and first through third colors are respectively assigned in the fourth subframe,
   wherein the display unit further includes
      a plurality of scanning lines,
      a plurality of data lines, and
      a plurality of light emission control lines,
   wherein the drive circuits include
      a scanning line drive circuit configured to select the plurality of scanning lines in order in each subframe interval,
      a data line drive circuit configured to apply, to the plurality of data lines, voltage that corresponds to a video signal in each line interval in each subframe interval following the color assignation rule, and
      a light emission control line drive circuit configured to drive the plurality of light emission control lines in each subframe interval following the color assignation rule,
   wherein the pixels include
      a data maintaining unit corresponding to one scanning line, one data line, and three or four light emission control lines, and holding voltage applied to a data line corresponding to a selection period of a corresponding scanning line,
      first through third light-emitting elements configured to emit light of the first through third colors, and
      first through third light emission control transistors provided between the data maintaining unit and the first through third light-emitting elements, having control terminals connected to a light emission control line of corresponding light emission control lines in accordance with the color assignation rule,
   wherein the pixels further include
      a full-emission control circuit configured to electrically connect between the data maintaining unit and the first through third light-emitting elements when selection voltage is applied to the fourth light emission control line corresponding to the fourth color, of the four corresponding light emission control lines, and
   wherein the full-emission control circuit further includes
      three transistors provided in parallel to the first through third light emission control transistors between the data maintaining unit and the first through third light-emitting elements, and having control terminals connected to the fourth light emission control line.

8. The display device according to claim 7, wherein, in the color assignation rule, the plurality of pixels are classified into the first through fourth groups such that pixels two pixels away in the first direction and two pixels away in the second direction belong to the same group.

9. The display device according to claim 7, wherein, in the color assignation rule, the plurality of pixels are classified into the first through fourth groups such that pixels two pixels away in the first direction and one pixel away in the second direction belong to the same group.

10. The display device according to claim 7, wherein, in the color assignation rule, the plurality of pixels are classified into the first through fourth groups such that pixels one pixel away in the first direction and two pixels away in the second direction belong to the same group.

11. The display device according to claim 7, wherein the first through third colors are one of red, green, and blue, and the fourth color is black.

12. The display device according to claim 7, wherein the first through third colors are one of red, green, and blue, and the fourth color is white.

* * * * *